(12) United States Patent
Lai et al.

(10) Patent No.: US 8,949,099 B1
(45) Date of Patent: Feb. 3, 2015

(54) METHOD AND SYSTEM FOR STEADY STATE SIMULATION AND NOISE ANALYSIS OF DRIVEN OSCILLATORS

(75) Inventors: Xiaolue Lai, San Jose, CA (US); Dan Feng, Los Altos, CA (US); Yu Zhu, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 914 days.

(21) Appl. No.: 12/618,920

(22) Filed: Nov. 16, 2009

Related U.S. Application Data

(60) Provisional application No. 61/274,097, filed on Jun. 10, 2009.

(51) Int. Cl.
*G06F 17/50* (2006.01)
*G01R 29/26* (2006.01)

(52) U.S. Cl.
USPC ............................................. 703/14; 702/70

(58) Field of Classification Search
USPC .................. 331/44; 703/14; 702/70
See application file for complete search history.

(56) References Cited

U.S. PATENT DOCUMENTS

| | | | |
|---|---|---|---|
| 5,943,637 A * | 8/1999 | Okumura et al. | 702/111 |
| 5,995,733 A * | 11/1999 | Roychowdhury | 716/113 |
| 6,154,716 A * | 11/2000 | Lee | 703/2 |
| 6,167,359 A * | 12/2000 | Demir et al. | 702/191 |
| 6,518,742 B1 * | 2/2003 | Narayan et al. | 324/76.39 |
| 6,529,859 B1 | 3/2003 | Demir et al. | |
| 7,035,782 B2 * | 4/2006 | Yang et al. | 703/14 |
| 7,332,974 B1 * | 2/2008 | Mehrotra et al. | 331/44 |
| 8,666,689 B1 * | 3/2014 | Lai | 702/70 |
| 2008/0048675 A1 * | 2/2008 | Ngoya et al. | 324/613 |

OTHER PUBLICATIONS

Gourary et al., New Numerical Technique for Cyclostationary Noise Analysis of Oscillators, Oct. 2007, Proceedings of the 2nd European Microwave ICs Conference, Munich Germany, pp. 375-378.*
The IEEE 100 The Authoritative Dictionary of IEEE Standards Terms, 2000, Seventh Edition, p. 1183.*
Roychowdhury, D. Long, P. Feldmann, "Cyclostationary Noise Analysis of Large RF Circuits with Multitone Excitations", 1998, IEEE J. of Solid-State Circuits, vol. 33, N 3, pp. 324-336.*

(Continued)

*Primary Examiner* — Kamini S Shah
*Assistant Examiner* — Juan Ochoa
(74) *Attorney, Agent, or Firm* — Holland & Knight LLP; Mark H. Whittenberger, Esq.

(57) ABSTRACT

In a circuit simulation tool in a computer system having one or more computer processors and computer-readable storage, a method for characterizing a driven oscillator circuit having an oscillator coupled to a time-varying input signal includes retrieving information provided in a circuit description of the oscillator circuit. The method also includes forming a frequency-domain harmonic balance equation for the oscillator circuit using the retrieved information provided in the circuit description of the oscillator circuit. The harmonic balance equation includes a first differential operator in a frequency domain of the input signal and a product of a differential operator in a second frequency domain of the oscillator and a frequency variable of the oscillator. The frequency variable is independent of the frequency domain of the input signal. The method further includes solving the harmonic balance equation to obtain a waveform description of the oscillator circuit.

38 Claims, 19 Drawing Sheets

(56) References Cited

OTHER PUBLICATIONS

Mehrotra et al., Next-Generation Silicon Analysis Tools for RF Integrated-Circuits, Jun. 11-13, 2006, Radio Frequency Integrated Circuits (RFIC) Symposium IEEE, pp. 1-4.*

Demir et al., Computing Phase Noise Eigenfunctions Directly From Steady-State Jacobian Matrices, Nov. 5-9, 2000, Computer Aided Design, ICCAD-2000, IEEE/ACM International Conference, pp. 283-288.*

Xiaolue Lai, Frequency aware PPV: A Robust Phase Macromodel for Accurate Oscillator Noise Analysis, 2008, Proceedings of the IEEE/ACM International Conference on Computer-Aided Design, pp. 803-806.*

X. Lai and J. Roychowdhury, A Multilevel Technique for Robust and Efficient Extraction of Phase Macromodels of Digitally Controlled Oscillators, Jul. 2006, Proc. IEEE Design Automation Conference, pp. 1017-1022.*

Adler, R., "A Study of Locking Phenomena in Oscillators," Proceedings of the I.R.E. and Waves and Electrons; Jun. 1946; vol. 34; pp. 351-357.

Armand, M., "On the Output Spectrum of Unlocked Driven Oscillators;" Proceedings of the IEEE; May 1969; vol. 57; pp. 798-799.

Kundert et al., "*Steady-State Methods for Simulating Analog and Microwave Circuits*," Chapter 5—Harmonic Balance Theory and Chapter 6—Implementing Harmonic Balance, The Kluwer International Series in Engineering and Computer Science, Copyright 1990, pp. 81-159, Kluwer Academic Publishers, Boston, USA.

Demir et al., "*Phase Noise in Oscillators: A Unifying Theory and Numerical Methods for Characterization*," IEEE Transactions on Circuits and Systems—Fundamental Theory and Applications, May 2000, vol. 47, pp. 655-674.

Mei et al, "Oscillator-AC: Restoring Rigour to Linearized Small-Signal Analysis of Oscillators" *ICCAD 2005*, Nov. 2005., pp. 603-608.

Demir et al., "*A Reliable and Efficient Procedure for Oscillator PPV Computaton, With Phase Noise Macromodeling Applications*," IEEE Transactions on Commuter-Aided Design of Integrated Cirucuits and Systems, Feb. 2, 2003, vol. 22, pp. 188-197.

Lai et al., "*Capturing Oscillator Injection Locking via Nonlinear Phase-Domain Macromodels*,"IEEE Transactions on Microwave Theory and Techniques, Sep. 9, 2004, vol. 52, pp. 2251-2261.

Roychowdhury, Jaijeet, "*Analyzing Circuits with Widely Separated Time Scales Using Numerical PDE Methods*," IEEE Transactions on Circuits and Systems—Fundamental Theory and Applications, May 5, 2001, vol. 48, pp. 578-594.

Narayan et al., "*Analyzing Oscillators Using Multitime PDE's*," IEEE Transactions on Circuits and Systems—Fundamental Theory and Applications, Jul. 7, 2003, vol. 50, pp. 894-903.

Demir, Alper, "Phase Noise in Oscillators: DAE's and Colored Noise Sources,"In *IEEE/ACM International Conference on Computer-Aided Design*, Nov. 1998, pp. 170-177.

X. Lai, Y. Zhu, and D.Feng. Steady State Simulation and Noise Analysis for Driven Oscillators. In *International Microwave Symposium 2009*, Jun. 2009.

* cited by examiner

Oscillator and mixer

Oscillator with power supply interference

METHOD AND SYSTEM FOR STEADY STATE SIMULATION AND NOISE ANALYSIS OF DRIVEN OSCILLATORS

CROSS-REFERENCES TO RELATED APPLICATIONS

This application claims priority to U.S. Provisional Application No. 61/274,097, filed Jun. 10, 2009, entitled "METHOD AND SYSTEM FOR STEADY STATE SIMULATION AND NOISE ANALYSIS OF DRIVEN OSCILLATORS," by inventors Xiaolue Lai, et al., commonly assigned, incorporated by reference herein for all purposes.

BACKGROUND OF THE INVENTION

The present invention relates generally to electronic circuit characterization and simulation techniques. More particularly, embodiments of the invention provide methods and systems for directly computing waveforms that describe driven autonomous circuits, e.g., a circuit having an oscillator and one or more periodic input signals.

As circuit size and complexity increase, circuit simulation tools are becoming indispensible. In electronic circuit design, a circuit is usually represented by a system of equations, with various circuit components represented by their mathematical models. The models and equations are continuously being developed and refined to meet the requirements of new device and circuit technologies and increasingly more demanding applications.

As an example, the design of oscillators has received much attention, because they are critical components in electronic systems, including communication systems, signal processing systems, and timing and clock systems in digital circuits. Accurate steady state simulation and phase noise prediction for oscillators are important functionalities of simulation and verification tools. While some advances have been made in the analysis and simulation of oscillator circuits, many challenges remain. For example, conventional circuit analysis and simulation techniques are inadequate in handling a driven oscillator circuit having periodic input signals in addition to the oscillator itself. Some of these limitations are described in more detail in a later section below.

Therefore, there is a need for improved circuit analysis simulation techniques for driven oscillator systems.

BRIEF SUMMARY OF THE INVENTION

Embodiments of the invention provides methods and systems for analysis and simulation of driven oscillators. In some embodiments, a system of equations is formulated for a driven oscillator circuit, in which the frequency of the local oscillator is treated as an extra unknown. With this formulation and the corresponding phase equation, solution techniques, such as multi-tone harmonic balance analysis can be performed to find wavefouii descriptions for the driven oscillator. In another embodiment, the small signal systems of driven oscillators are shown to be singular, so that traditional small signal approaches are not applicable to driven oscillators. According to embodiments of the invention, phase noise in driven oscillators can be analyzed using a multitone phase noise vector (MPNV) method.

An embodiment of the present invention provides a method for characterizing a driven oscillator circuit having an oscillator coupled to a time-varying input signal. The method can be used in a circuit simulation tool implemented in a computer system having one or more computer processors and a computer-readable storage medium. The method includes retrieving from the computer-readable storage medium information provided in a circuit description of the oscillator circuit. The method also includes forming with one or more of the computer processors a frequency-domain harmonic balance equation for the oscillator circuit using the retrieved information provided in the circuit description of the oscillator circuit. The harmonic balance equation includes a first differential operator in a frequency domain of the input signal and a product of a differential operator in a second frequency domain of the oscillator and a frequency variable of the oscillator. The frequency variable is independent of the frequency domain of the input signal. The method further includes solving with one or more of the computer processors the harmonic balance equation to obtain a waveform description of the oscillator circuit.

In another embodiment, a method is provided for frequency domain analysis of a driven oscillator circuit.

In another embodiment, a computer system is provided for performing circuit simulation including various methods for analyzing driven oscillator circuits.

In another embodiment, a computer readable storage medium includes computer code which, when retrieved and executed, results in performing various methods for analyzing driven oscillator circuits.

In yet another embodiment, a system for characterizing a driven oscillator circuit having an oscillator coupled to a time-varying input signal includes means for retrieving a circuit description of the oscillator circuit, means for forming a frequency-domain harmonic balance equation, and means for solving the harmonic balance equation to obtain a waveform description of the oscillator circuit.

In various embodiments, a method for analyzing phase noise in a driven oscillator circuit includes forming a Jacobian matrix for the driven oscillator circuit, in which the oscillator frequency variable is independent of the frequency domain of the input injection signal. The Jacobian matrix is used in formulating a multitone phase noise vector (MPNV) equation, which defines a multitone phase noise vector that enables the calculation of phase noise.

A further understanding of the nature and advantages of the present invention may be realized by reference to the remaining portions of the specification and the drawings.

DETAILED DESCRIPTION OF THE INVENTION

Figure 1B:
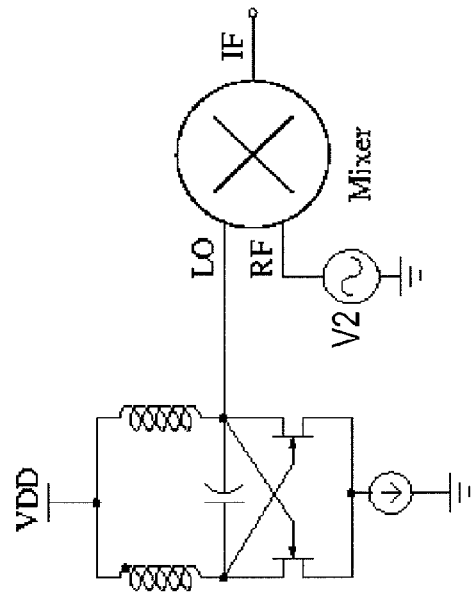
FIG. 1B is a schematic diagram illustrating a mixer circuit.
Figure 1A:
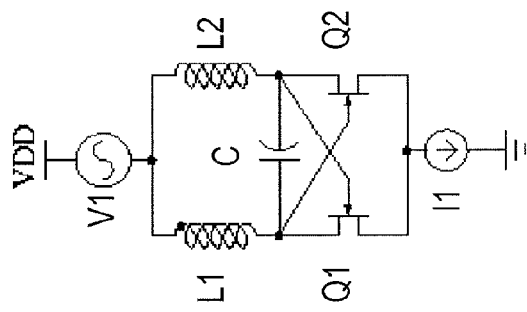
FIG. 1A is a schematic diagram illustrating an oscillator with a periodic interference signal generated from a power supply.

Modern electronic circuits often include large and complex oscillating systems. In analog designs, oscillators are sometimes driven by periodic signals. An example is the unlocked driven oscillator—the oscillator directly driven by, but not locked to, periodic injection signals. FIG. 1A is a schematic diagram illustrating an oscillator with a periodic interference signal generated from a power supply. In FIG. 1A, the oscillator includes a capacitor C, inductors L1 and L2, cross coupled transistors Q1 and Q2, and a current source I1. In addition, voltage source V1 represents the periodic interference signal from power supply VDD. FIG. 1B is a schematic diagram illustrating a mixer circuit including an oscillator, similar to the oscillator of FIG. 1A, and an RF input signal V2. Such mixer circuits are widely used in communication and signal processing applications.

Figure 2:
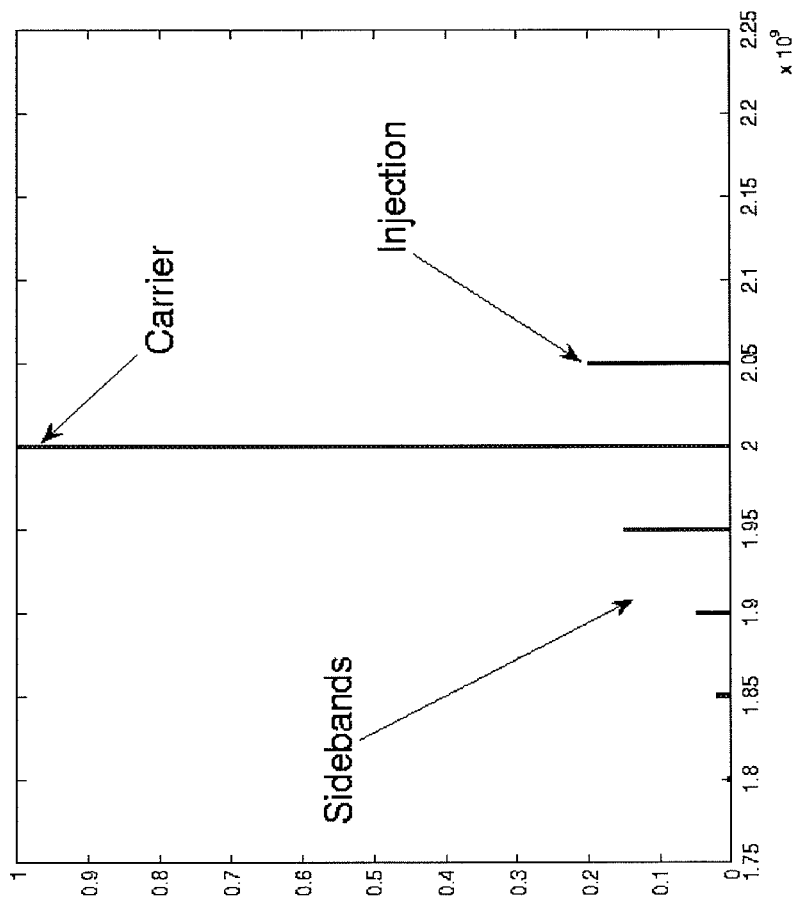
FIG. 2 is a power spectrum diagram illustrating sidebands produced by injection of a periodic signal to a carrier.

Unlocked driven oscillators, such as those depicted in FIGS. 1A and 1B, have varying spectra with asymmetric sidebands around the carrier frequency, that is, the injection signal creates a number of sidebands on the other side of the carrier frequency. FIG. 2 is a power spectrum diagram illustrating sidebands produced by injection of a periodic signal to a carrier. Since many sidebands are created by the injection signal, the unlocked driven oscillator is a multi-tone system. Those sidebands convert the flicker noise around DC to series offset frequencies around the carrier frequency, and increase the complexity of circuit analysis.

It can be seen that the interaction between an oscillator and a period injection signal can have a great effect on the circuit. Therefore, the characterization of multi-tone systems and phase noise plots of unlocked driven oscillators are of great interest to designers. Unfortunately, previous oscillator simulation and noise analysis methods are not applicable to the multi-tone systems.

As design technologies advance, more function blocks are put together and need to be simulated together. In addition, interferences between blocks become significant and need to be taken into consideration. Direct simulation of circuit waveforms and noise analysis of oscillator-involved systems, instead of stand-alone oscillators, have become a pressing demand from designers. Additionally, noise analysis is especially important in oscillator circuits, because even a small noise can lead to drastic changes in the frequency spectrum and timing properties of the circuit. Without the capability for direct analysis and simulation, noise analysis often must be carried out in two steps, which is inconvenient and may introduce accuracy loss, because the coupling between the local oscillator and the mixer is not taken into account. Hence, a method that directly simulates the steady state behavior and predicts the phase noise of driven oscillators is of great interest.

Figure 3:
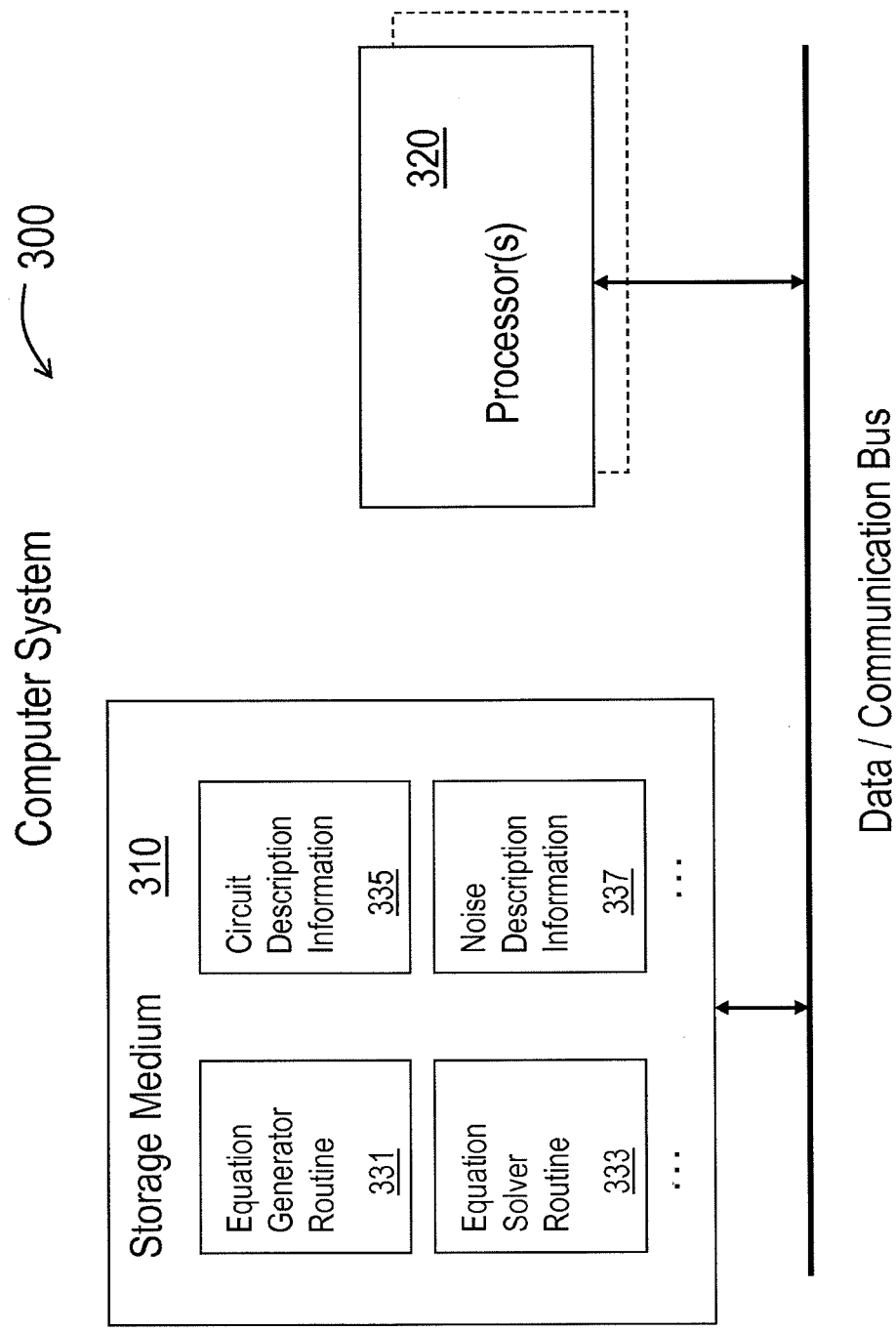
FIG. 3 is a simplified block diagram of a computer system 300 that can be used for characterizing a circuit according to an embodiment of the present invention.

FIG. 3 is a simplified block diagram of a computer system 300 that can be used for performing circuit simulation according to an embodiment of the present invention. As shown, computer system 300 includes a storage medium 310 and one or more processors 320 coupled to storage medium 310 through a data/communication bus. Depending on the embodiment, processor 320 may include a single processor, multiple processors, or a number of local or distributed processors operating in parallel. Storage medium 310 can include various memory and mass storage devices, such as DRAM, SRAM, non-volatile memory devices, read only memory (ROM), disk storage, optical CD, DVD, etc. Storage medium 310 are configured to store one or more computer instruction codes and data, while processor 320 is configured to retrieve the code and data, and to execute the computer code. In the embodiment of FIG. 3, storage medium 310 includes computer codes such as equation generator routine 331 and equation solver routine 333. Storage medium 310 also includes various data files, such as circuit description information 335 and noise description information 337.

In some embodiments, when computer programmable instructions or code are retrieved from storage medium 310 and executed by processor 320, certain circuit simulation functions are performed. For example, in an embodiment, a method is carried out for characterizing a driven oscillator circuit having an oscillator coupled to a time-varying input signal. The method includes:

retrieving from the computer-readable storage medium information provided in a circuit description of the oscillator circuit;

forming with one or more of the computer processors a system of differential equations for the oscillator circuit; and solving with one or more of the computer processors the harmonic balance equation to obtain a waveform description of the oscillator circuit.

More details of the methods for analyzing and simulating driven oscillator circuits, including phase noise analysis, are described further below.

An embodiment of the invention provides a method for analyzing a multi-tone circuit having an oscillator and periodic input signals. Merely as an example, an oscillator circuit having one periodic input signal is analyzed here. However, the method can be extended to oscillators with multiple periodic input signals.

The differential algebraic equation (DAE) equation for a driven circuit can be expressed as:

$$\frac{d}{dt}q(x(t)) + f(x(t)) = b(t), \tag{1}$$

where:
x(t) is the oscillator's solution,
q( . . . ) is the dynamic part,
f( . . . ) is the static part of the circuit equation, and
b(t) is a periodic input to the oscillator.

In contrast, an oscillator circuit without a driving input signal would be described by the following DAE:

$$\frac{d}{d}q(x(t)) + f(x(t)) = 0, \tag{2}$$

Since the oscillator can provide a periodic output without any periodic input, the input to the equation is 0.

As shown above, Eq. 1 is a system of equations describing the behavior of a circuit, and x(t) can represent circuit variables, such as node voltages and/or currents in a circuit branch. In some embodiments, q( . . . ), f( . . . ), and b(t) are formulated based on a circuit description of the oscillator circuit. For example, the circuit description may be in a netlist form that can be used as an input to a circuit simulator. Alternatively, a circuit description may be in a schematic form, which can be converted by a design entry program into a netlist or other forms acceptable to a circuit simulator. In a circuit simulation tool, the circuit description is usually stored in a computer-readable storage medium, which can be retrieved by a processor.

According to the multi-time partial differential equation (MPDE) method, Eq. 1 can be expressed in terms of two time variables in two separate time domains:

$$\left[\frac{\partial}{\partial t_1} + \frac{\partial}{\partial t_2}\right] q(x(t_1, t_2)) + f(x(t_1, t_2)) = b(t_1), \quad (3)$$

where:

$x(t_1, t_2)$ is the bivariate form of $x(t)$, $t_1$ is the time of the injection signal from the periodic input, and $t_2$ is the time of the local oscillator.

For a system involving an oscillator and a time-varying input, circuit analysis can be simplified using a warped-time multi-time partial differential equation (WaMPDE), which is formed as follows:

$$\left[\frac{\partial}{\partial t_1} + \omega_2(t_1)\frac{\partial}{\partial t_2}\right] q(x(t_1, t_2)) + f(x(t_1, t_2)) = b(t_1), \quad (4)$$

where $\omega_2(t_1)$ is the frequency of the oscillator, which is modulated by the injection signal.

Eq. 4 is difficult to solve in both time domain and frequency domain. In particular, it is difficult to directly apply multi-tone harmonic balance to Eq. 4. It is noted that $\omega_2(t_1)$ in Eq. 4 is a function of $t_1$, which means the system has N (harmonic number of the injection tone) extra unknowns. It is hard to find N phase equations to make the system square for large signal analysis. Conventional phase equation may work for small signal analysis, but it tends to over-constrain the large signal waveform and makes harmonic balance fail to converge.

According to an embodiment of the present invention, an alternative multi-tone equation for a driven oscillator circuit can be expressed as follows:

$$\left[\frac{\partial}{\partial t_1} + \omega_2\frac{\partial}{\partial t_2}\right] q(x(t_1, t_2)) + f(x(t_1, t_2)) = b(t_1), \quad (5)$$

Note that in Eq. 5, the oscillator frequency $\omega_2$ is independent of $t_1$, the time domain of the injection signal. This formulation greatly simplifies circuit analysis of a driven oscillator system, and allows efficient solutions of both steady-state circuit waveforms and analysis of phase noise.

In another embodiment, the driven oscillator circuit may include a second time-varying input signal. In this case, the system of equations has the following form:

$$\left[\frac{\partial}{\partial t_1} + \frac{\partial}{\partial t_2} + \omega_3\frac{\partial}{\partial t_3}\right] q(x(t_1, t_2, t_3)) + f(x(t_1, t_2, t_3)) = b(t_1, t_2), \quad (6)$$

where:

$t_1$ is the time of the injection signal from the first periodic input, $t_2$ is the time of the injection signal from the second periodic input, and $t_3$ is the time of the local oscillator.

Note that, compared with Eq. 5, Eq. 6 includes a third differential operator for the second input signal, and the frequency variable of the oscillator $\omega_3$ is independent of the time domains of both the first and the second input signal ($t_1$ and $t_2$, respectively).

Figure 4:
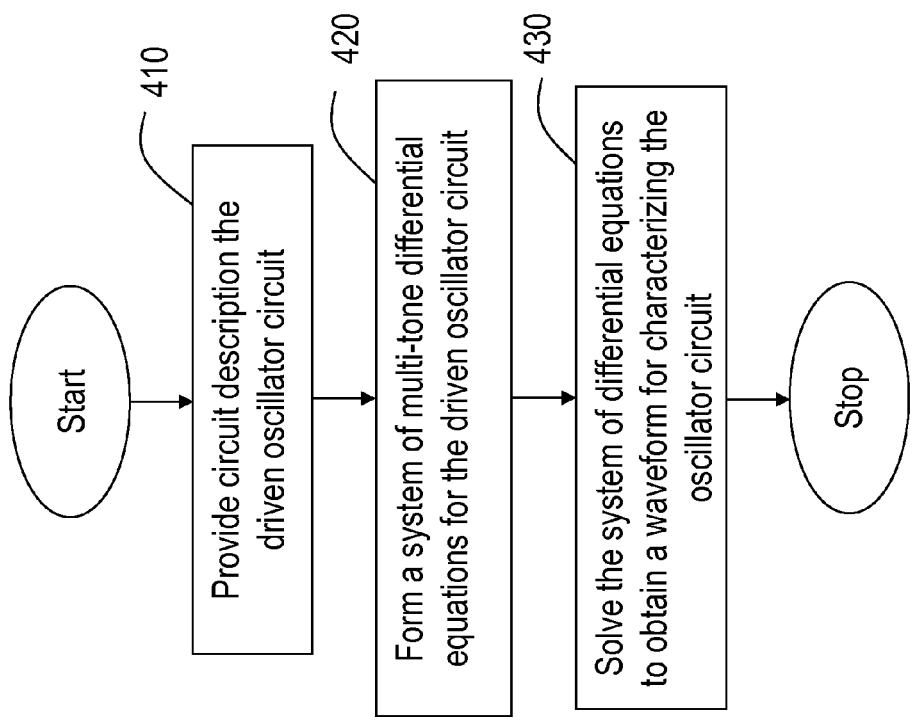
FIG. 4 is a simplified flowchart illustrating a method for characterizing an oscillator having a periodic input signal according to an embodiment of the present invention.

The method described above is summarized in the flowchart in FIG. 4, and can be briefly outlined below. As shown in FIG. 4, in this embodiment, the method for characterizing a driven oscillator circuit includes:

1. Step 410: Provide a circuit description of the oscillator circuit that includes an oscillator and a time-varying input signal coupled to the oscillator;
2. Step 420: Form a system of differential equations for the oscillator circuit using information provided in the circuit description—an example is shown in Eq. 5; and
3. Step 430: Solve the system of differential equations to obtain a waveform for characterizing the oscillator circuit.

In step 410, the circuit description can include a netlist, a schematic diagram, or other forms of data structure describing the components and connections of the circuit. The circuit description are usually stored in a computer storage medium such as storage medium 310 described above in connection with FIG. 3.

In step 420, a system of differential equations for the oscillator circuit is formed using information provided in the circuit description. In the embodiment described in Eq. 5, the method includes forming a system of differential equations, Eq. 5, for the oscillator circuit using information provided in the circuit description. The system of differential equations of Eq. 5 includes a first differential operator $$\frac{\partial}{\partial t_1}$$

in a time domain of the input signal and a term $$\omega_2\frac{\partial}{\partial t_2},$$

which is a product of a second differential operator $$\frac{\partial}{\partial t_2}$$

in the time domain of the oscillator and a frequency variable $\omega_2$ that represents a frequency of the oscillator. In this formulation, the frequency of the oscillator $\omega_2$ is treated as an extra unknown, with the frequency variable $\omega_2$ being independent of the time domain $t_1$ of the input signal.

In step 430, the system of differential equations is solved to obtain a waveform for characterizing the oscillator circuit. In an embodiment, the time-domain formulation described in Eq. 5 can be solved in the time domain, using conventional matrix inversion or decomposition methods, or iterative methods such as the Newton-Raphson method. Alternatively, the solution can also be carried out in the frequency-domain, as described below.

In another embodiment, a frequency-domain solution can be found by applying multi-tone Fourier series to Eq. 5, and the frequency-domain harmonic balance function for a driven oscillator can be written as:

$$H(X) = (\Omega_1 + \omega_2\Omega_2)Q + F = B, \quad (7)$$

where:
X is the oscillator solution in the frequency domain,
Q and F are the dynamic and static parts of the circuit equation in the frequency domain,
B is the injection signal in the frequency domain,
$\Omega_1$ and $\Omega_2$ are frequency domain differential operators for $t_1$ and $t_2$., respectively, and
$\omega_2$ is the oscillator frequency, which is an unknown.

It is noted that $\omega_2$ is independent of the frequency domain of the input injection signal.

In circuit simulation tools, fast Fourier transform (FFT) techniques are often used in the analysis of large systems of equations. In an embodiment, FFT techniques can be applied to Eq. 5 to obtain to the frequency-domain harmonic balance equation in Eq. 7.

In contrast, the harmonic balance equation of an undriven oscillators has the following form:

$$H(X)=\omega\Omega Q(X)+F(X)=0 \qquad (8)$$

where:
X is the oscillator solution in the frequency domain,
Q and F are the dynamic and static parts of the circuit equation in the frequency domain,
$\Omega$ is a frequency domain differential operators, and
$\omega$ is the oscillator frequency, which is an unknown.

Since there is no injection signal, the right hand side of Eq. 8 is zero.

In another embodiment, the driven oscillator circuit may include a second time-varying input signal. In this case, the harmonic equation has the following form:

$$H(X)=(\Omega_1+\Omega_2+\omega_3\Omega_3)Q+F=B, \qquad (9)$$

where:
$\Omega_1$ is the frequency domain differential operators for time $t_1$ of the first injection signal from the first periodic input,
$\Omega_2$ is the frequency domain differential operators for time $t_2$ of the second injection signal from the second periodic input, and
$\Omega_3$ is the frequency domain differential operators for time $t_3$ of the local oscillator.

Note that, compared with Eq. 7, Eq. 9 includes a third differential operator in a frequency domain of the second input signal, and the frequency variable $\omega_3$ of the oscillator is independent of the frequency domains of both the first and the second input signal.

In an embodiment, Eq. 9 is solved in the frequency domain to yield steady-state solutions for the driven oscillators, using conventional solution methods. In an embodiment, Eq. 9 is solved using the Newton-Raphson method, which is an iterative method for finding a zero of a function. The Newton-Raphson method is based on the observation that the zero point of a function's derivative (or, equivalently, the tangent) at a given starting point is nearer to the zero point of the function itself than the original point. According to the Newton-Raphson method, for a function of a single variable, the derivative of the function is first calculated at a given starting point, the tangent of the function at that point is formed, and the zero point of the tangent is used as a new starting point finding the zero point of a new tangent. Each successive zero point is closer to the function's solution than the previous one. This procedure is repeated until an acceptable accuracy is reached. In applying the Newton-Raphson method to complex systems of equations, a Jacobian matrix is often used to represent a differentiation or derivative operation.

According to embodiments of the present invention, a two-tone Jacobian matrix for frequency-domain harmonic balance function Eq. 7 for a driven oscillator is defined as:

$$J=(\Omega_1+\omega_2\Omega_2)C+G, \qquad (10)$$

where:
C is $$\frac{dq}{dx}$$

in the frequency domain, and
G is $$\frac{df}{dx}$$

in the frequency domain.

In an embodiment, an augmented Jacobian matrix, which can be used for phase analysis, is defined for the multi-tone driven oscillator circuit as follows:

$$J_{aug}=\begin{pmatrix} J & \Omega_2 Q \\ p & 0 \end{pmatrix}, \qquad (11)$$

where $J=(\Omega_1+\omega_2\Omega_2)C+G$ is defined in Eq. 10 above.

Note $J_{aug}$ includes an extra column $\Omega_2 Q$, which is $$\frac{dq}{dt_2}$$

in the frequency domain, and an extra row p, which is the phase equation.

In contrast, an augmented Jacobian matrix for a undriven oscillator is defined as:

$$J_{aug}=\begin{pmatrix} J & \Omega Q \\ p & 0 \end{pmatrix} \qquad (12)$$

with the Jacobian matrix for the undriven oscillator defined as:

$$J=\omega\Omega C+G, \qquad (13)$$

It is clear that Eqs. 12 and 13 can not be used for the analysis of a driven oscillator.

Figure 5:
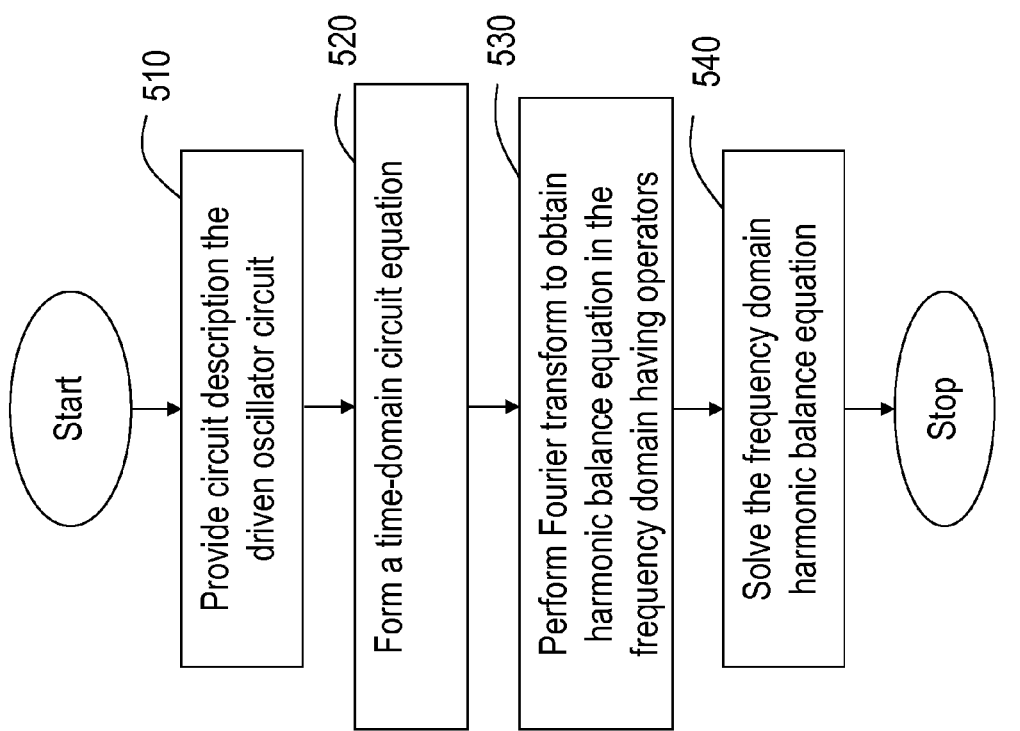
FIG. 5 is a simplified flowchart illustrating a method for characterizing an oscillator having a periodic input signal according to another embodiment of the present invention.

The method described above is summarized in the flow-chart in FIG. 5 and briefly outlined below. As shown in the embodiment of FIG. 5, the method for characterizing a driven oscillator circuit includes:

1. Step 510: Provide a circuit description for an oscillator having a periodic input;
2. Step 520: Form a time-domain circuit equation;
3. Step 530: Perform Fourier transform to obtain harmonic balance equation in the frequency domain (e.g., Eq. 7); and
4. Step 540: Solve the frequency-domain harmonic balance equation.

Steps 510 and 520 are similar to steps 410 and 420 described in connection with FIG. 4. In an example, Eq. 5 is formed based on a netlist or schematic description of the oscillator circuit.

In step 530, a Fourier series operation is performed on the equation obtained in step 520. In the embodiment described above, a harmonic balance equation as described in Eq. 7 for the oscillator circuit is formed using information provided in the circuit description. Eq. 7 includes a first differential operator $\Omega_1$ in a frequency domain of the input signal and a term $\omega_2\Omega_2$, which is a product of a second differential operator $\Omega_2$ in the time domain of the oscillator and a frequency variable $\omega_2$ that represents a frequency of the oscillator. In this formulation, the frequency of the oscillator $\omega_2$ is treated as an extra unknown, with the frequency variable $\omega_2$ being independent of the time domain $t_1$ of the input signal.

In step 540, when the frequency-domain harmonic balance equation is solved in the frequency domain, e.g., by using the Newton-Raphson method, time-domain waveforms of voltages and currents can be derived using inverse fast Fourier transform (IFFT) techniques. From such solutions, various design parameters can be derived, for example, frequency spectrum, phase noise plots, etc.

Figure 6:
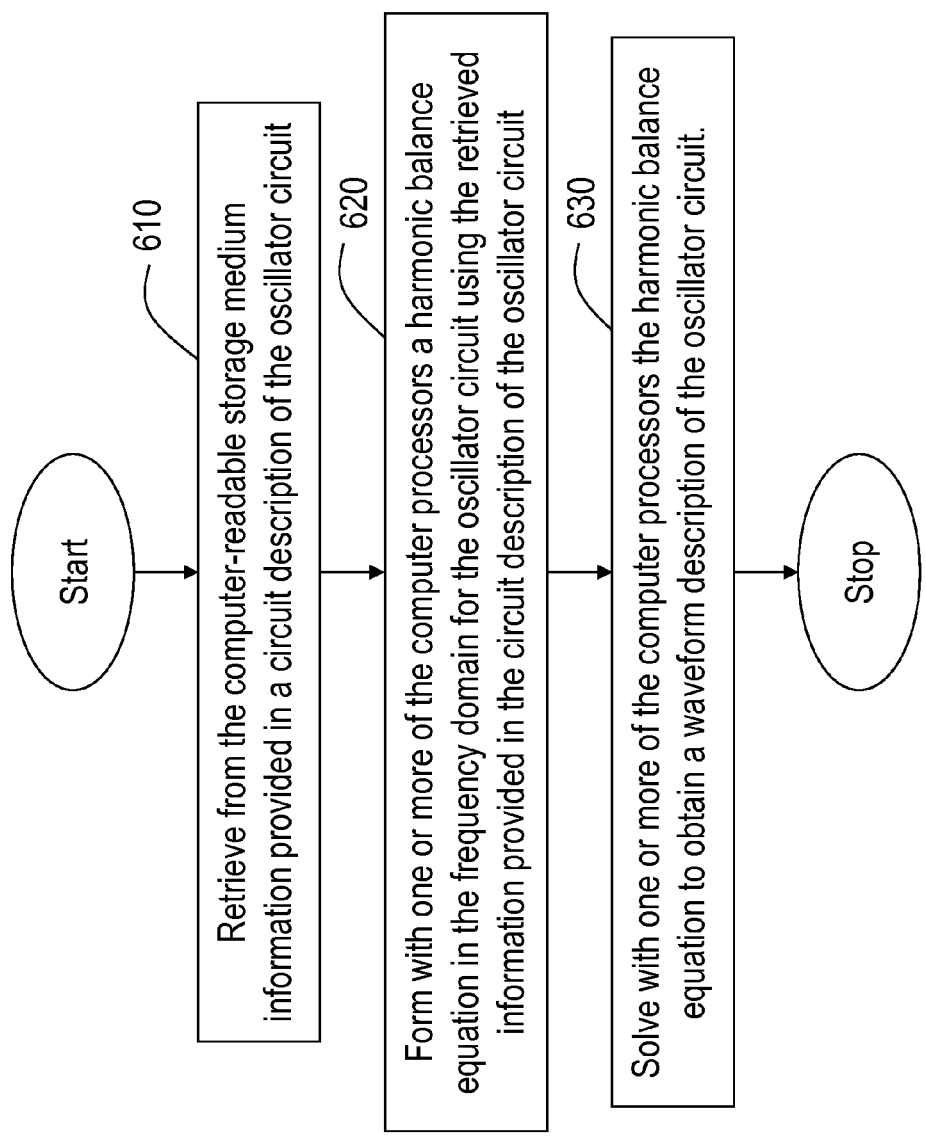
FIG. 6 is a simplified flowchart illustrating a method for characterizing an oscillator having a periodic input signal according to yet another embodiment of the present invention.

In some embodiments of the present invention, the methods described above are implemented in a circuit simulation tool. In a specific embodiment, the circuit simulation tool is implemented in a computer system having one or more computer processors and a computer-readable storage medium, such as computer system 300 described above in conjunction with FIG. 3. The method in this embodiment is summarized in the flowchart in FIG. 6, and briefly outlined below.

1. Step 610: Retrieve from the computer-readable storage medium information provided in a circuit description of the oscillator circuit;
2. Step 620: Form with one or more of the computer processors a harmonic balance equation in the frequency domain for the oscillator circuit using the retrieved information provided in the circuit description of the oscillator circuit; and
3. Step 630: Solve with one or more of the computer processors the harmonic balance equation to obtain a waveform description of the oscillator circuit.

Step 610 includes retrieving from the computer-readable storage medium, e.g., storage medium 310 depicted in FIG. 3, information provided in a circuit description of the oscillator circuit. The circuit description can be based on a netlist or a schematic, or other forms of circuit description described above. In step 620, the harmonic balance equation is in the form of Eq. 7. As described above, Eq. 7 includes a first differential operator in a frequency domain of the input signal and a product of a second differential operator in a frequency domain of the oscillator and a frequency variable of the oscillator, wherein the frequency variable is independent of the frequency domain of the input signal. Step 630 is similar to step 540 described above in conjunction with the method of FIG. 5, and the details are not repeated here.

It is noted that in this particular embodiment, the $t_2$ dependency of the oscillator frequency is ignored. Hence, the frequency modulation due to the injection signal is treated, in a way, as amplitude modulations. If the frequency modulation is strong and is not adequately described by amplitude modulation, the iterative method may not converge. However, according to embodiments of the invention, the convergence of the method can be improved by using more harmonics on the injection tone. Further details regarding convergence of the method is described in a section further below.

As mentioned above, noise analysis is important for an oscillator circuit. Many circuit components include inherent noise sources; for example, resistors can generate thermal noise, and semiconductor devices can have flicker noise, etc. In circuit analysis, these noise sources are often represented by voltage or current sources and/or power spectrum density (PSD). In a circuit simulation tool, the circuit descriptions for the noise sources are often stored in a computer storage medium, which can be the same storage medium that stores the description for the circuit elements themselves, and can be retrieved for noise analysis. However, conventional circuit simulators do not provide adequate noise information for oscillators.

A technique for computing the phase noise of an undriven oscillator was proposed in A. Demir, et al., Phase noise in oscillators; a unifying theory and numerical methods for characterization, *IEEE Transaction On Circuits and Systems—I: Fundamental Theory and Applications,* 47(5):655-674, May 2000 (herein "Demir"), which is incorporated herein by reference.

According to embodiments of the present invention, it has been found the small signal system of driven oscillators can be shown to be singular, and a new method is provided for the analysis of phase noise of multi-tone systems including driven oscillators based on a multitone phase noise vector (MPNV) concept.

To show that the Jacobian matrix in Eq. 10, $J=(\Omega_1+\omega_2\Omega_2)C+G$, is singular, or that $$((\Omega_1+\omega_2\Omega_2)C+G)X=0 \quad (14)$$

has a non-trivial solution, Eq. 14 is written in time domain below:

$$\left(\frac{\partial}{\partial t_1}+\frac{\partial}{\partial t_2}\right)(c(t_1,t_2)x(t_1,t_2))+g(t_1,t_2)x(t_1,t_2)=0, \quad (15)$$

where $$c(t_1,t_2)=\frac{d}{dx}q(x(t_1,t_2))|x_s(t_1,t_2) \text{ and } g(t_1,t_2)=\frac{d}{dx}f(x(t_1,t_2))|x_s(t_1,t_2),$$

where $x_s(t_1,t_2)$ is the steady state solution that satisfies the time-domain Eq. 3.

To show that Eq. 15 has a non-trivial solution, operator $$\frac{\partial}{\partial t_2}$$

is applied to both sides of Eq. 3. Since $t_1$ and $t_2$ are independent, $$\frac{\partial}{\partial t_2}(b(t_1))=0$$

is always true, $$\frac{\partial}{\partial t_2}\left[\left(\frac{\partial}{\partial t_1}+\frac{\partial}{\partial t_2}\right)q(x_s(t_1,t_2))+f(x_s(t_1,t_2))\right]=0 \quad (16)$$

$$\left(\frac{\partial}{\partial t_1}+\frac{\partial}{\partial t_2}\right)\frac{\partial q(x_s(t_1,t_2))}{\partial t_2}+\frac{\partial f(x_s(t_1,t_2))}{\partial t_2}=0 \quad (17)$$

$$\left(\frac{\partial}{\partial t_1}+\frac{\partial}{\partial t_2}\right)\left(c(t_1,t_2)\frac{\partial}{\partial t_2}x_s(t_1,t_2)\right)+g(t_1,t_2)\frac{\partial}{\partial t_2}x_s(t_1 t_2)=0 \quad (18)$$

From Eq. 18, $$u_1(t_1, t_2) = \frac{\partial}{\partial t_2} x_s(t_1, t_2) \tag{19}$$

is a non-trivial solution of Eq. 18, and its Fourier series, $U=\Omega_2 X_S$, is a non-trivial solution of Eq. 14.

Thus, according to embodiments of the invention, the small system of driven oscillator is singular, and an MPNV equation can be defined for phase noise analysis for such systems. In an embodiment, the linear periodic time-varying (LPTV) system of Eq. 18 has a Floquet eigenvalue of 1, and corresponding right Floquet eigenvector is $u_1(t_1,t_2)$. The MPNV—the left Floquet eigenvector—is defined by the adjoint system of Eq. 18, and is to be scaled using (20)

$$v(t_1,t_2)c(t_1,t_2)u(t_1,t_2)\equiv 1. \tag{20}$$

The frequency domain representation of the adjoint system of Eq. (18) is $$((\Omega_1+\omega_2\Omega_2)C+G)^H X=0, \tag{21}$$

and the frequency domain representation of Eq. 20 is $$<\Omega_2 Q, V_1>=1, \tag{22}$$

where $\Omega_2 Q$ is $$\frac{\partial}{\partial t_2} q(t_1, t_2)$$

in the frequency domain.

According to an embodiment of the invention, an equation for the MPNV for the driven oscillator circuit can be obtained by combining Eqs. 21 and 22:

$$\begin{pmatrix} J & \Omega_2 Q \\ p & 0 \end{pmatrix}^H \begin{pmatrix} V_1 \\ r \end{pmatrix} = \begin{pmatrix} 0 \\ 1 \end{pmatrix}, \tag{23}$$

where:
$V_1$ is the MPNV of the driven oscillator,
J is the Jacobian matrix as defined above in Eq. 10, and
p is a vector to make the equation non-singular.
Note the matrix $$\begin{pmatrix} J & \Omega_2 Q \\ p & 0 \end{pmatrix}^H$$

in Eq. 23 is the transpose conjugate of Eq. 11, the harmonic balance augmented Jacobian matrix of the multi-tone autonomous system, and $J=(\Omega_1+\omega_2\Omega_2)C+G$ is the Jacobian matrix described above in the steady-state solution. Thus, the MPNV of the driven oscillators can be calculated directly from the steady state solution Jacobian matrix by solving the MPNV equation of Eq. 23.

As describe above, the MPNV solution for an undriven oscillator is based on an augmented Jacobian matrix defined as:

$$J_{aug} = \begin{pmatrix} J & \Omega Q \\ p & 0 \end{pmatrix}, \tag{12}$$

where the Jacobian matrix for an undriven oscillator is defined as:

$$J=\omega\Omega C+G. \tag{13}$$

The MPNV equation of Eq. 23 can be solved using conventional methods, such as matrix inversion or an iterative method. A similar solution procedure as disclosed in Demir can be used to solve the MPNV equation of Eq. 23 for a multi-tone system provided in embodiments of the invention.

Once the MPNV is extracted, the phase noise of the oscillator can be predicted using the following equation:

$$S(f) = \sum_{i=-N}^{N} X_i X_i^* S_i(f + if_0), \tag{24}$$

where:

$$S_i(f) = \frac{f_0^2 i^2 \sum_{k=1}^{n} |V_{0_k}|^2 S_{N_k}(f)}{\pi^2 f_0^4 i^4 \left(\sum_{k=1}^{n} |V_{0_k}|^2 S_{N_k}(f)\right)^2 + f^2} \tag{25}$$

In Eq. 24, $X_i$ is the Fourier coefficient of the oscillator output at harmonic index i, $V_{0k}$ is the DC Fourier coefficient of the MPNV of the node k, and $S_{Nk}$ is the power spectrum density (PSD) of all colored noise sources applied to the node k. Note that Eqs. (24) and (25) have the same form as the phase noise spectrum calculation equations in Demir, which provides more details of phase noise spectrum calculation. The MPNV provided in embodiments of the invention enables the analysis of driven autonomous circuits, such as an oscillator coupled to one or more periodic input signals.

The method described above for characterizing phase noise in a driven oscillator circuit including a periodic input signal can be briefly summarized below.
1. Provide a Jacobian matrix for an oscillator having periodic input signals;
2. Formulate an MPNV equation (e.g., Eq. 23) using the Jacobian matrix;
3. Solve the MPNV equation for the MPNV; and
4. Calculate phase noise using the MPNV and equations such as Eqs. 24 and 25.

The multi-tone harmonic balance circuit simulation and MPNV extraction techniques described above were evaluated using two circuit examples: a driven LC oscillator and an RF receiver with a mixer, a local oscillator, and a divider. Frequency spectrum and time domain waveforms were simulated, and typical RF analysis was performed, such as periodic noise analysis and IP3 (Third order intercept point) analysis, on the two circuits. The BSIM3 (Berkeley Short-channel IGFET Model) device model was used in the simulation. FIGS. 7-18 are diagrams illustrating characterization results of various oscillator circuits according to embodiments of the present invention.

Figure 7:
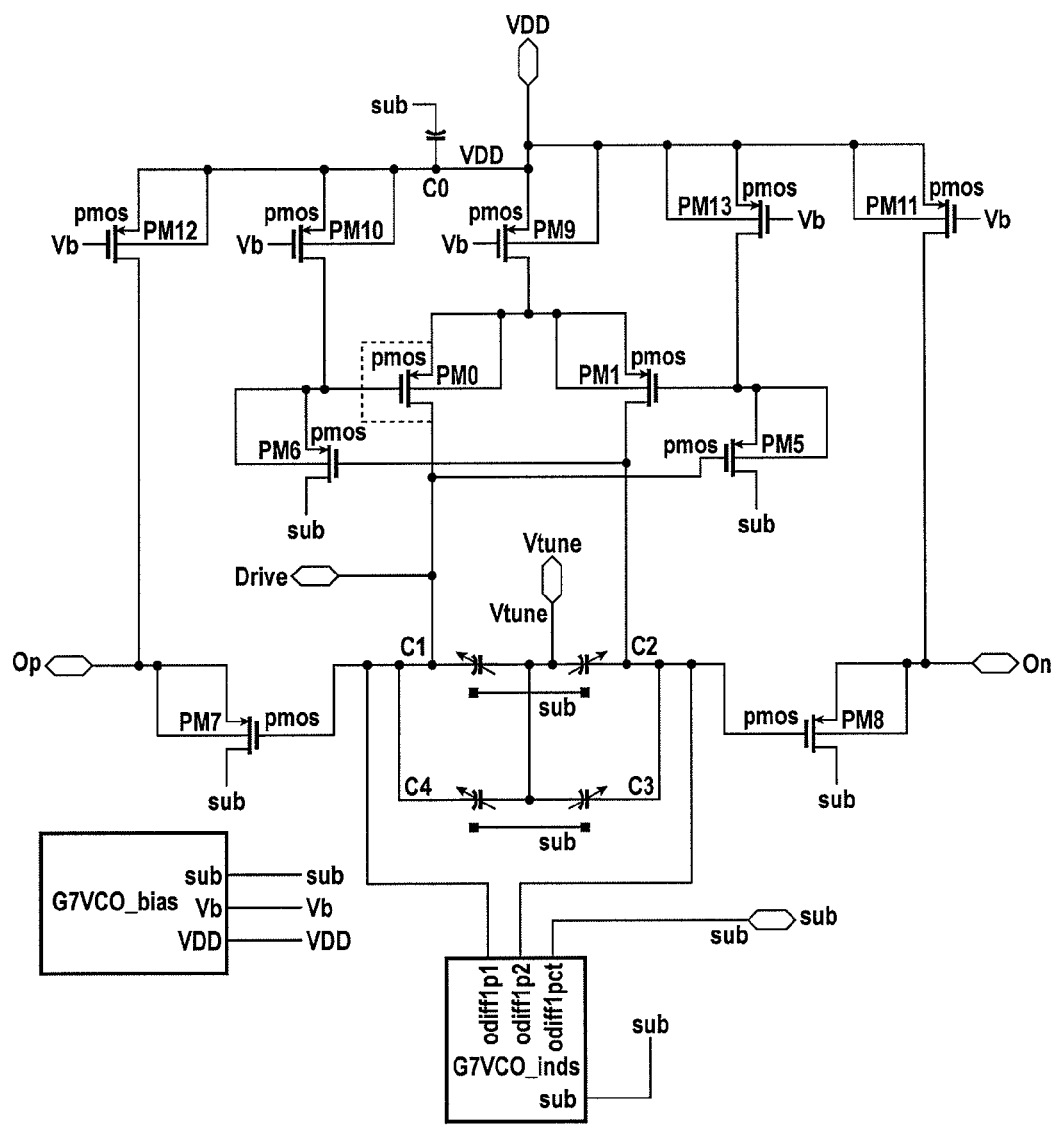
FIGS. 7-19 are various diagrams illustrating characterization results of driven oscillator circuits according to embodiments of the present invention.

FIG. 7 is a schematic diagram illustrating a driven oscillator, which has the free-running frequency of 5 GHz. A signal having a frequency close to the oscillator's fundamental frequency was injected and the multi-tone autonomous harmonic balance method was used to simulate the steady state of the drive oscillator. Then a power supply interference was injected to the oscillator, and phase noise was calculated using the MPNV technique described above.

Figure 8:
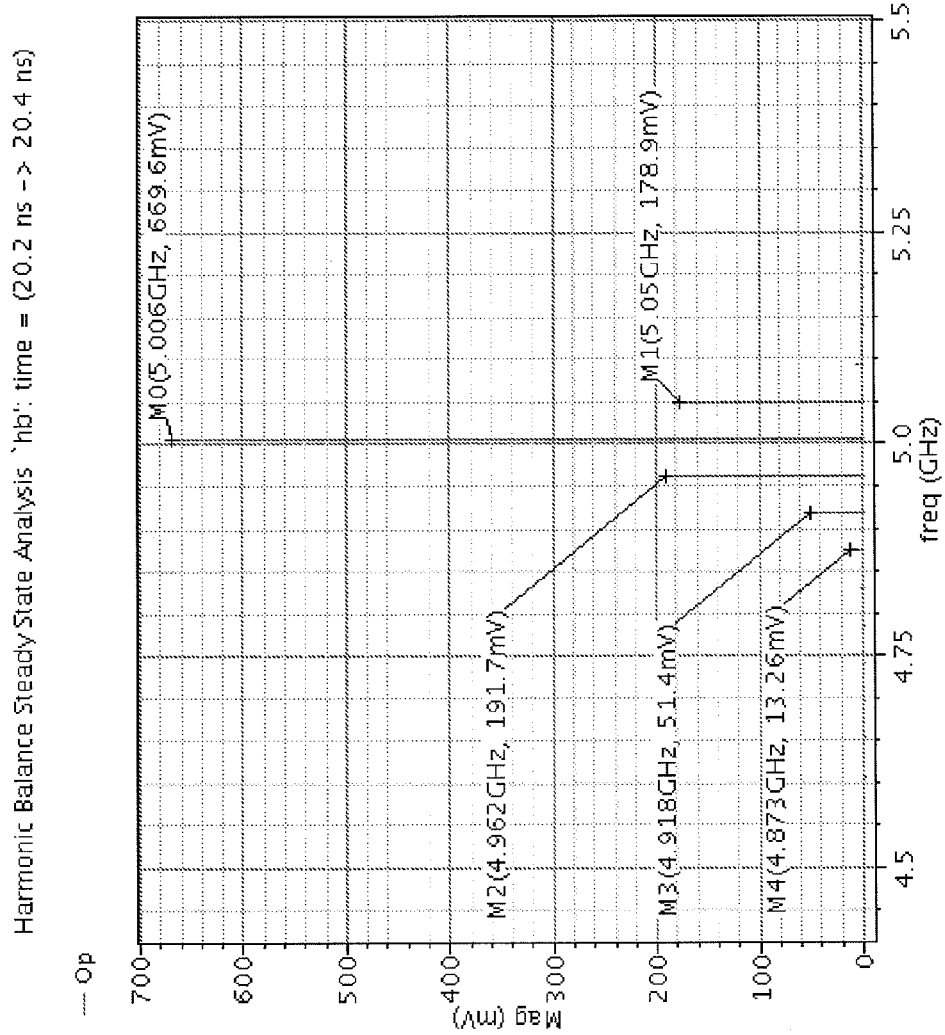
Figure 9:
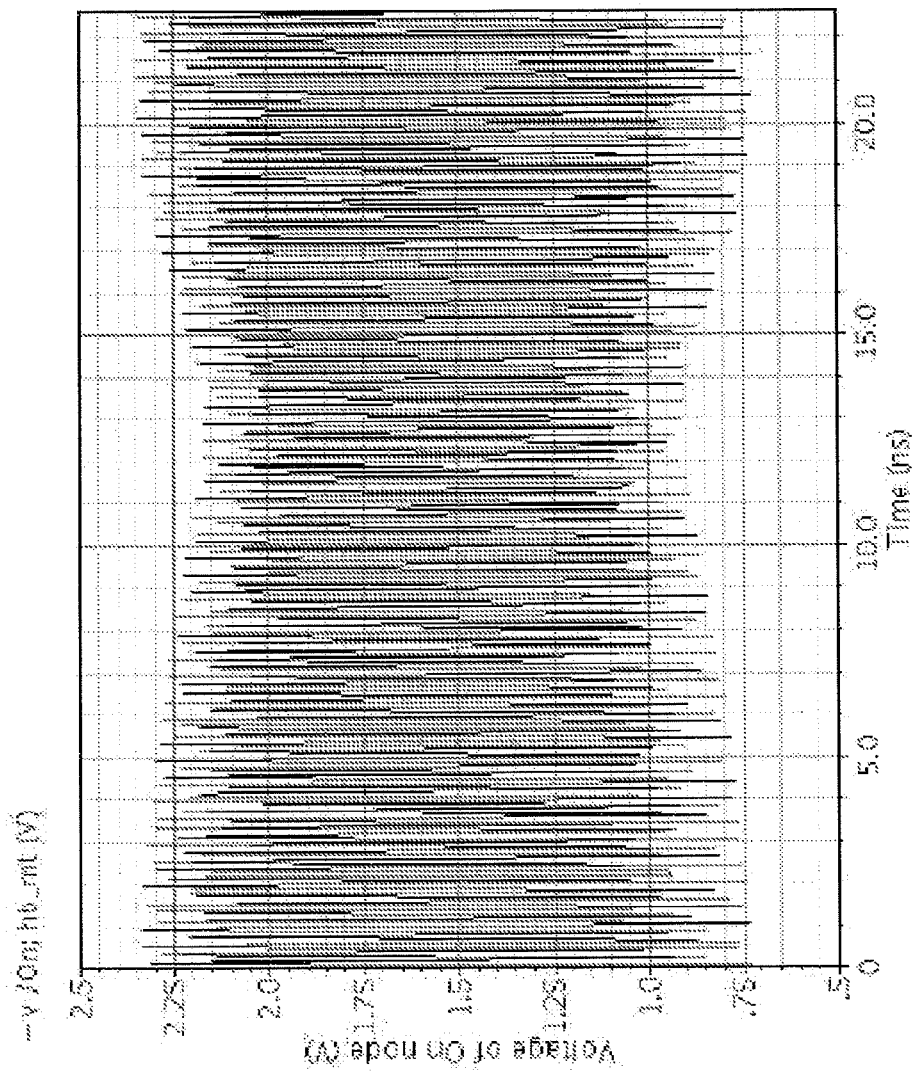

In the first simulation, a periodic signal was injected to node "Drive" on the LC oscillator. The injection frequency was 5.05 GHz, and the injection magnitude was 0.5 mA. FIG. 8 illustrates the simulated spectrum, which is similar to the theoretical spectrum depicted in FIG. 2. As can be seen in FIG. 8, the asymmetric spectrum includes a series of sidebands generated by the injection signal on the other side of the carrier frequency. An example of the time domain waveform is shown in FIG. 9.

Figure 10:
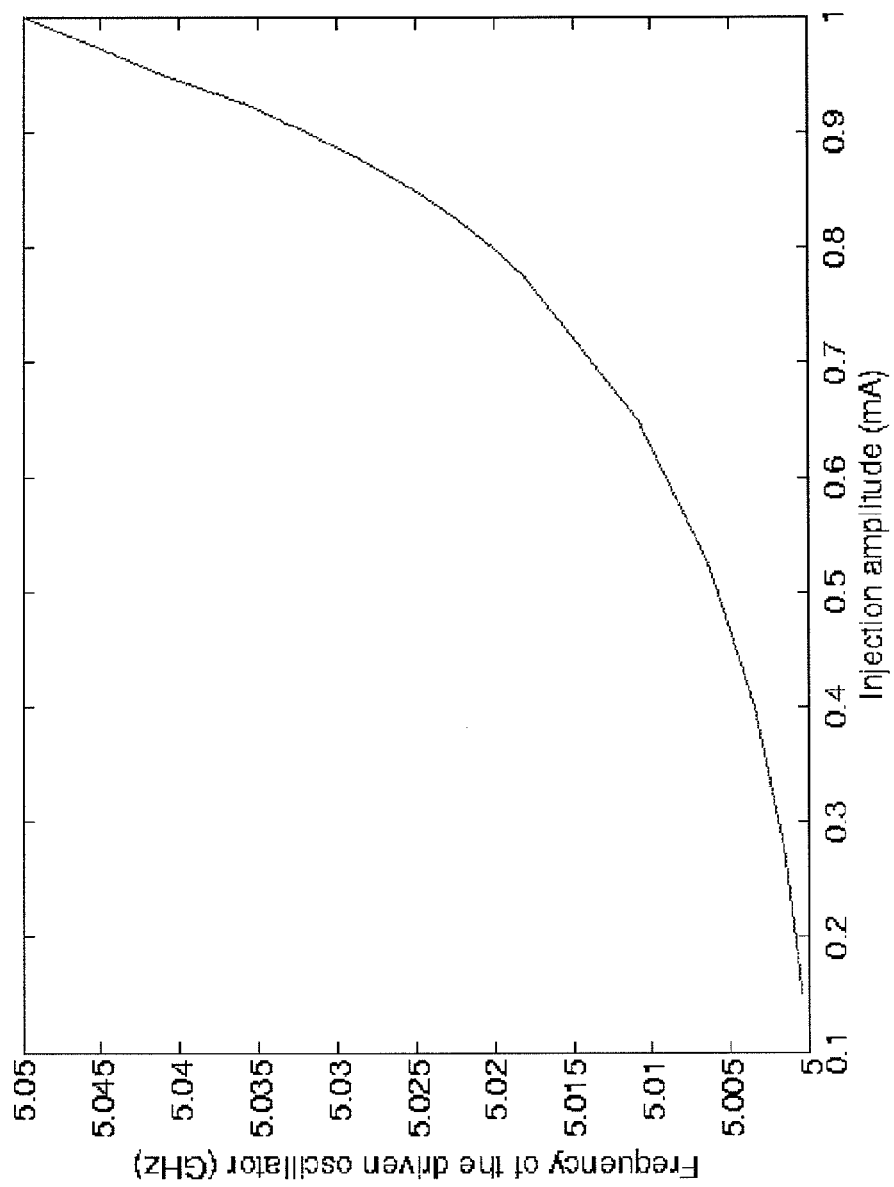

In the second simulation, a 5.05 GHz signal was injected to node "Drive" and the injection magnitude was swept from 0.025 mA to 1 mA. The steady states of the driven oscillator were simulated with different injection magnitudes. FIG. 10 plots the relationship between oscillation frequency and injection magnitude. It can be seen that when the injection magnitude increases to 1 mA, the driven oscillator has the frequency of 5.05 GHz, namely, the oscillator is locked by the injection signal at this injection strength.

In the next simulation, the injection on the node "Drive" was disabled. Instead, a small sinusoidal perturbation to the power supply of the oscillator was applied, with a perturbation frequency of 5 MHz and a perturbation magnitude of 33 mV. Periodic noise analysis was performed for this driven oscillator using the MPNV technique described above, and the results were compared with the free-running oscillator (the same LC oscillator without the power supply perturbation).

Figure 11:
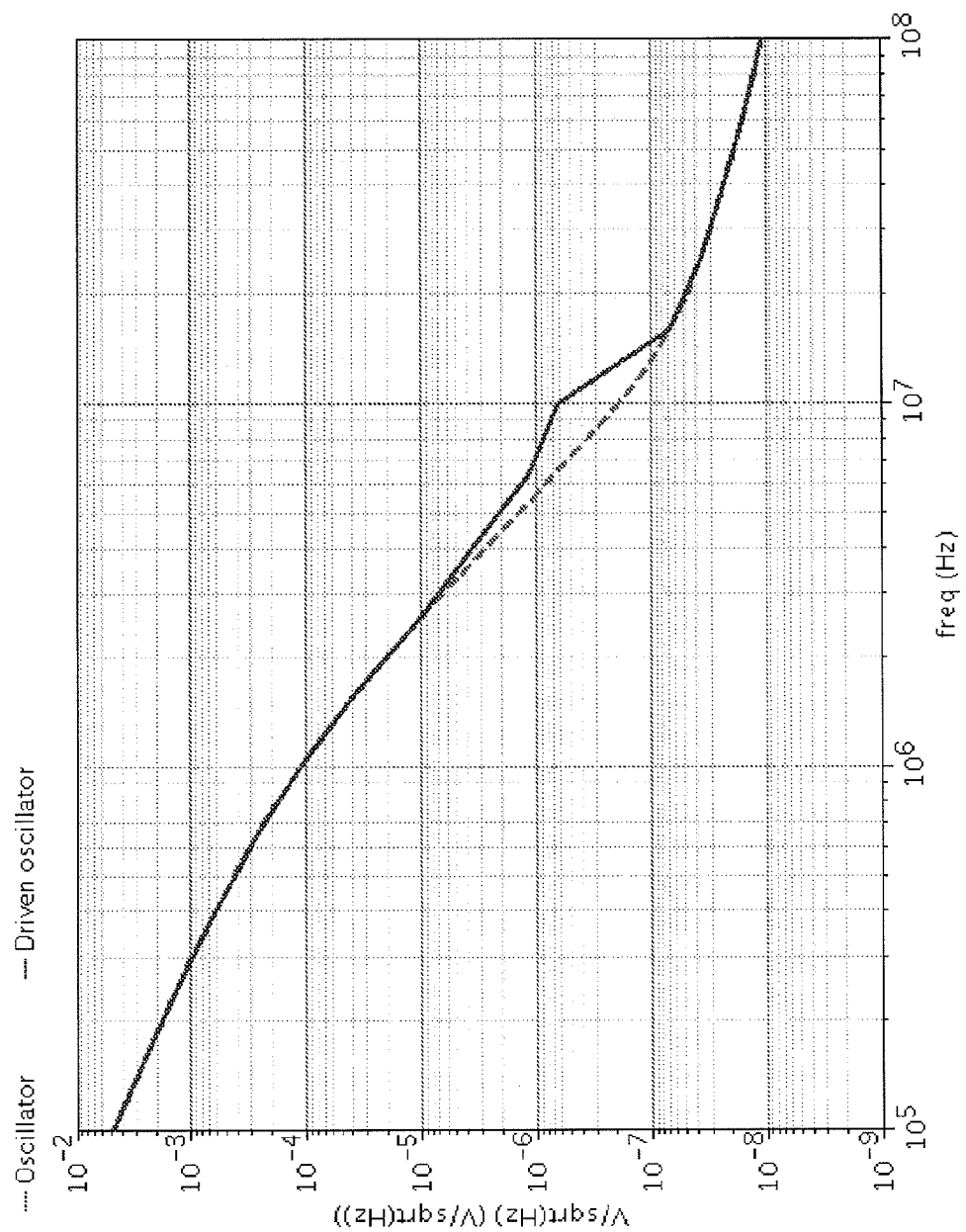

FIG. 11 illustrates the result of a coarse frequency sweep at 5 steps per decade. Under the small power supply perturbation, the driven oscillator has a similar noise output as the free-running oscillator, except for small differences at offset frequencies between 2 MHz to 12 MHz, where the driven oscillator has higher noise magnitude.

Figure 12:
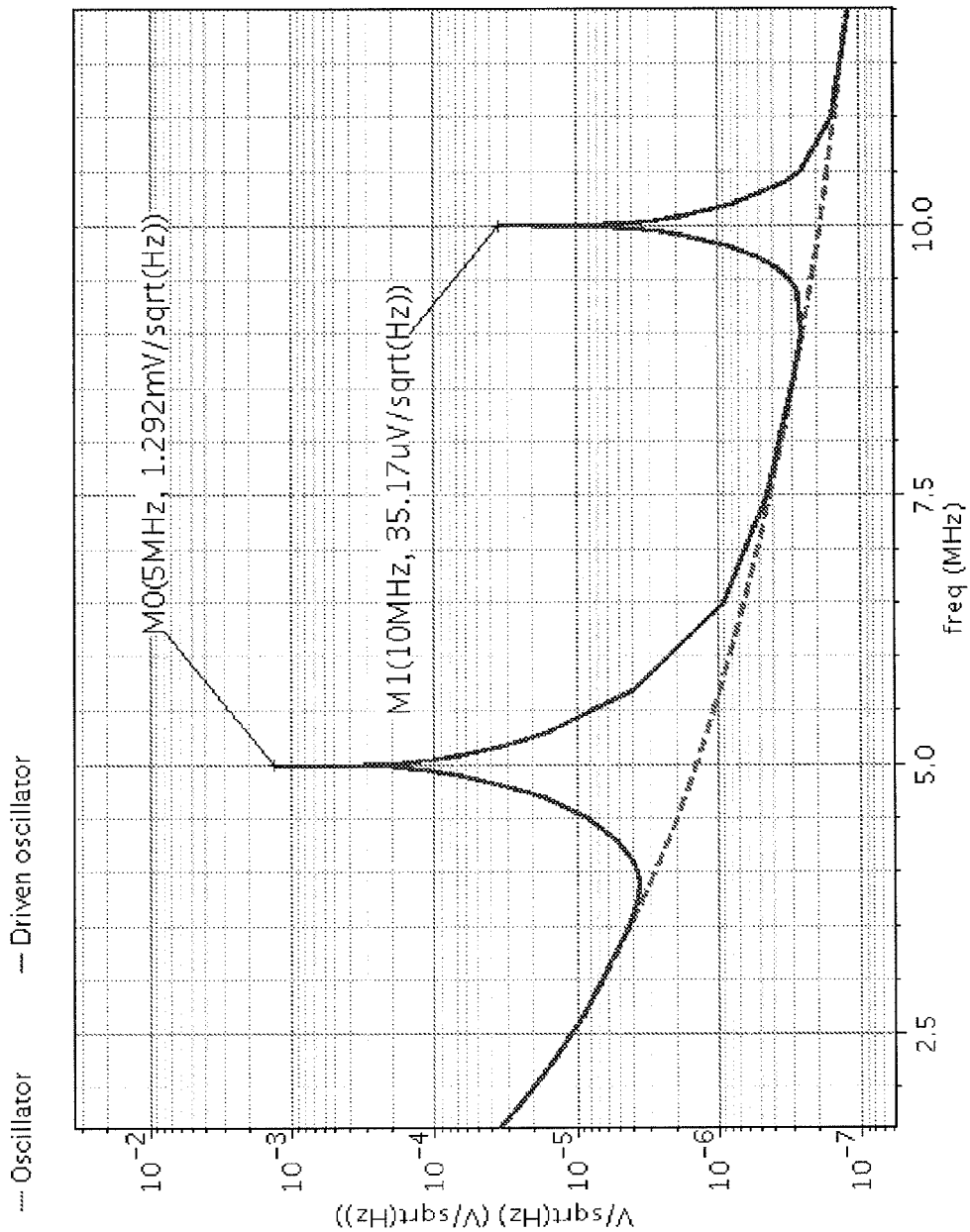

FIG. 12 illustrates the result of a detailed frequency sweep for the frequency range from 2 MHz to 12 MHz. The two spikes at the offset frequencies of 5 MHz and 10 MHz are due to the flicker noise converted by the injection signal, and the interval of the spikes is 5 MHz because the frequency of the injection is 5 MHz.

Figure 13:
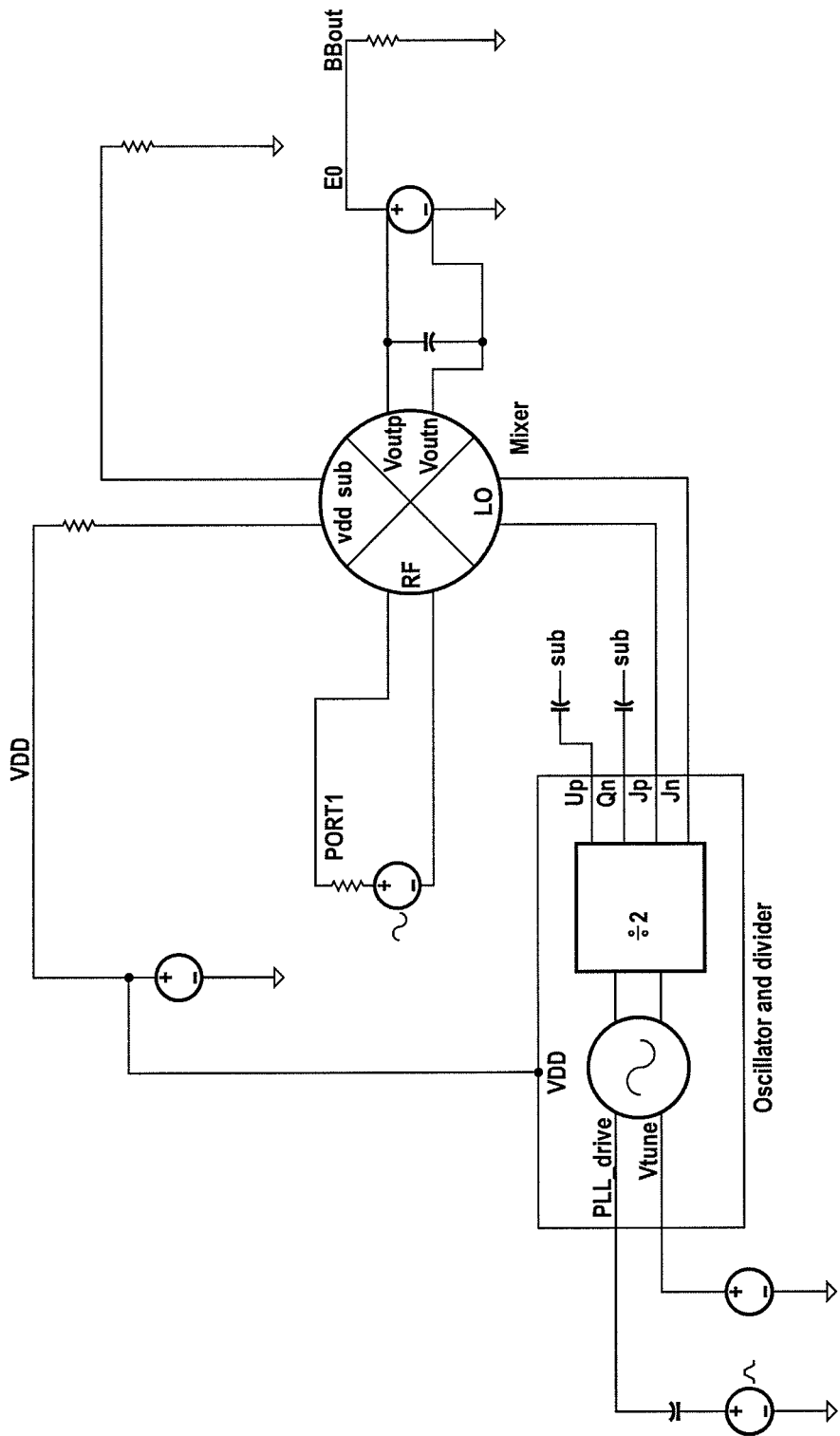

FIG. 13 shows our second example, a receiver circuit with an RF mixer, a local oscillator, and a divider. The local oscillator has a frequency of 5 GHz, which is divided by 2 and fed to the "LO" ports of the mixer. The whole receiver circuit was directly simulated using the multi-tone technique according to embodiments of the invention, and the results to the traditional macromodel-based oscillator simulation method were compared. The results shown below demonstrate that the approach based on embodiments of the invention offers better accuracy and provides great convenience.

Figure 14:
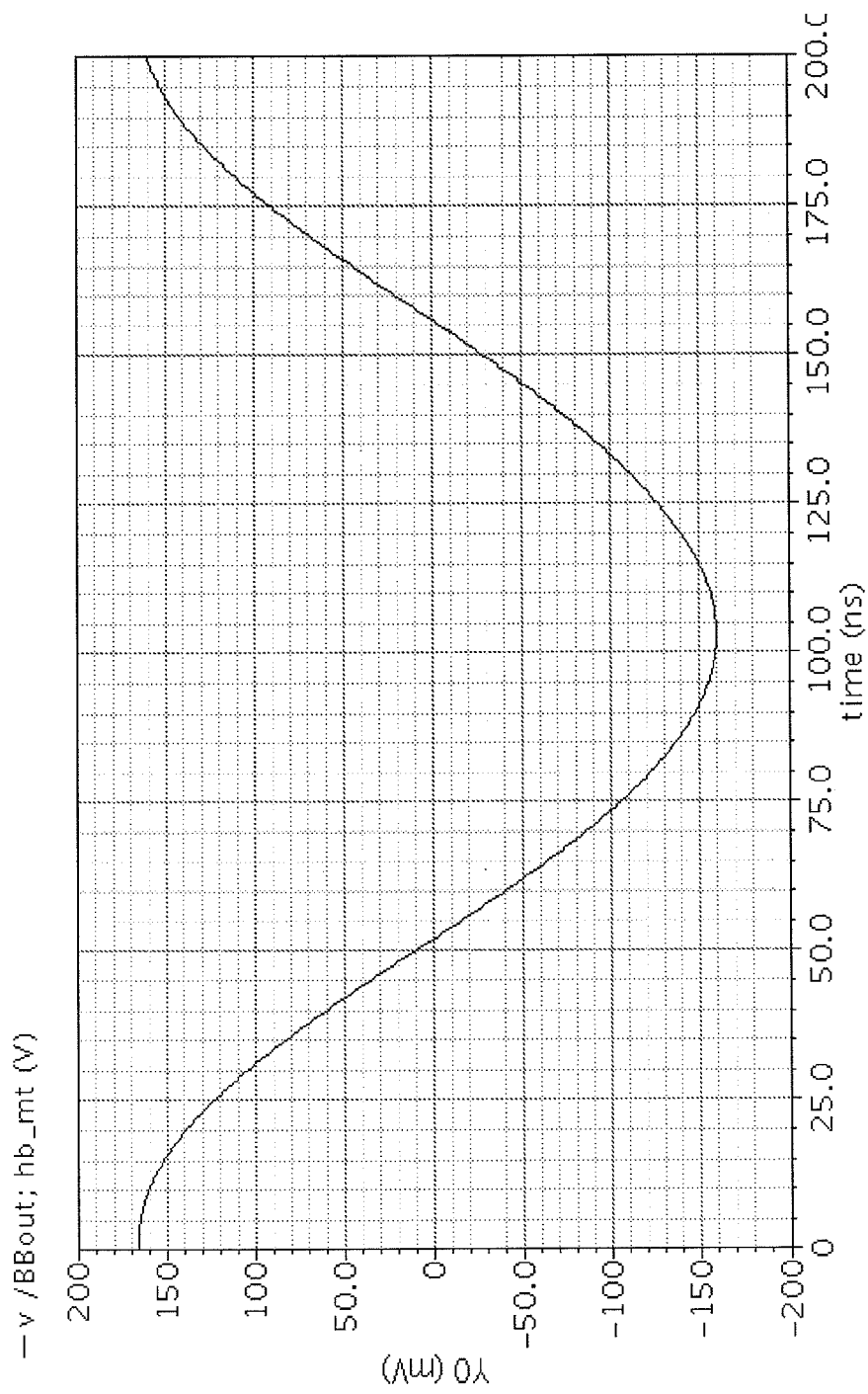
Figure 15:
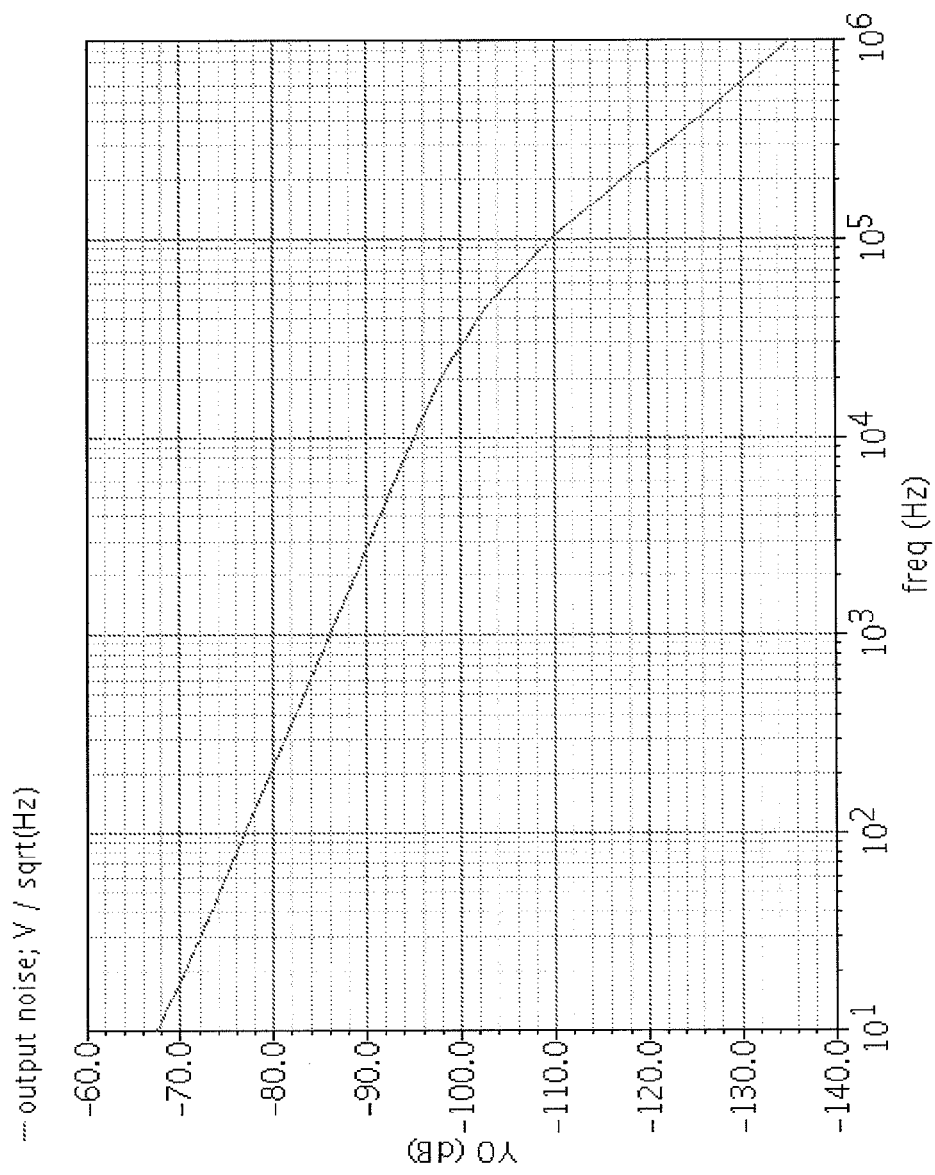

In the first simulation, the steady state waveforms and the output noise of the receiver were simulated. An RF signal having a frequency of 5.005 GHz and a power of 30 dBm was applied to the "RF" ports of the mixer. FIG. 14 illustrates the time domain waveform of the output node 'BBout' based on multi-tone autonomous simulation on the circuit. It can be seen that the output of the mixer is a 5 MHz sinusoidal signal, with an amplitude of about 165 mA. A periodic noise analysis over this steady state was performed over a relative frequency sweep (relative to the mixer output frequency) range from 10 Hz to 1 MHz. The noise result is plotted in FIG. 15.

Some of the advantages of the methods according to embodiments of the invention are demonstrated using simulation of the third order intercept point (IP3) of the receiver. When a circuit is driven by two RF tones (e. g., $f_{rf1}$ and $f_{rf2}$), the third order intercept point (IP3) is the intercept point of the first order fundamental term ($f_{rf1}$ or $f_{rf2}$) and the third order intermodulation term ($2f_{rf1}-f_{rf2}$ or $2f_{rf2}$ and $f_{rf1}$) expressed in decibel form. The IP3 is very important for evaluating the linearity of analog circuits, especially for power amplifiers and transceivers. Three approaches were taken for this evaluation:

1. Full circuit simulation including the oscillator and two RF signals using the multitone autonomous simulation method described above according to embodiments of the invention;
2. Macromodel simulation method in which the oscillator is replaced by a sine voltage macromodel; and
3. Macromodel simulation with the oscillator replaced by a piecewise linear (PWL) macromodel intended to represent the output of the stand-alone oscillator.

Figure 16:
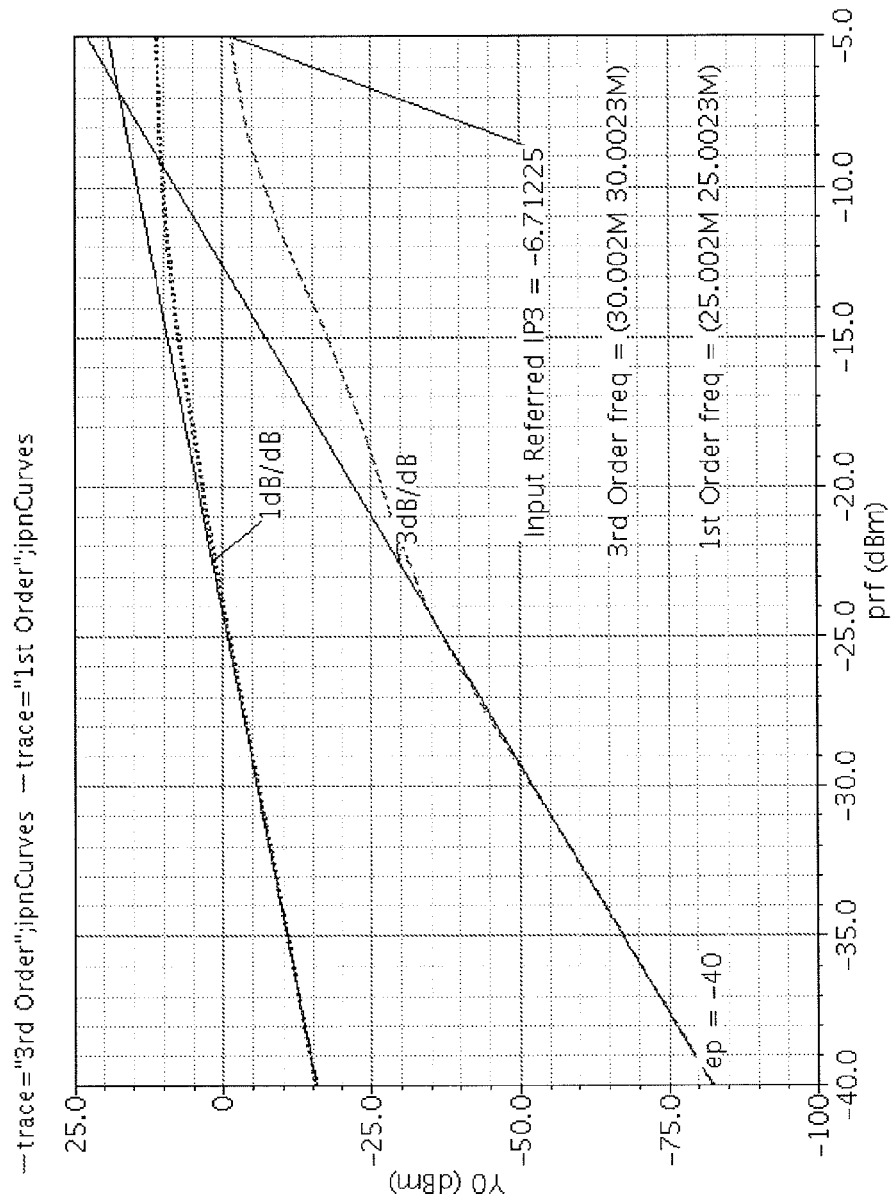

In this example, two RF signals having frequencies 2.475 GHz and 2.480 GHz, respectively, were added to the "RF" port of the mixer circuit of FIG. 13. Using this input setting, the first order fundamental frequency was 25 MHz, or 20 MHz, and the third order intermodulation frequency was 30 MHz, or 15 MHz. FIG. 16 plots the simulation results using the multi-tone autonomous simulation technique described above, over the RF power range from −40 dBm to −4 dBm. As shown, the input referred IP3 of the receiver is at −6.71 dB.

Figure 17:
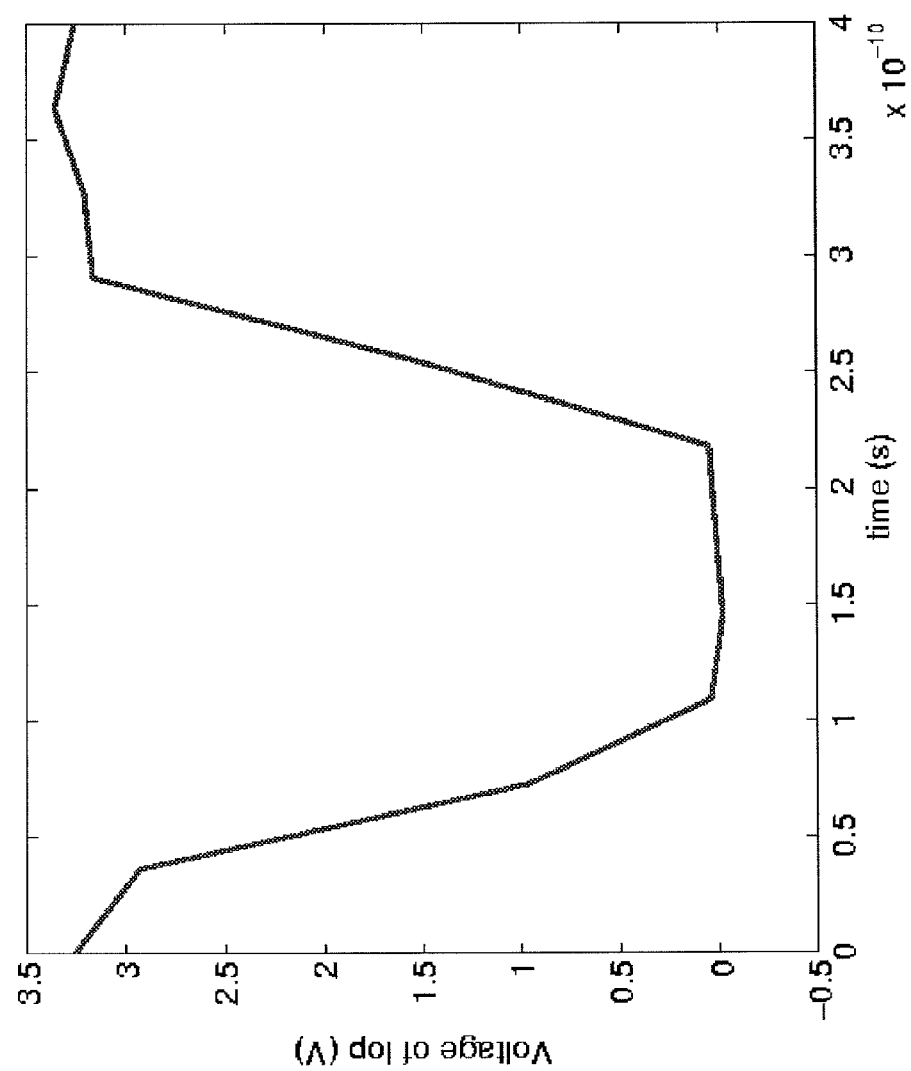
Figure 18:
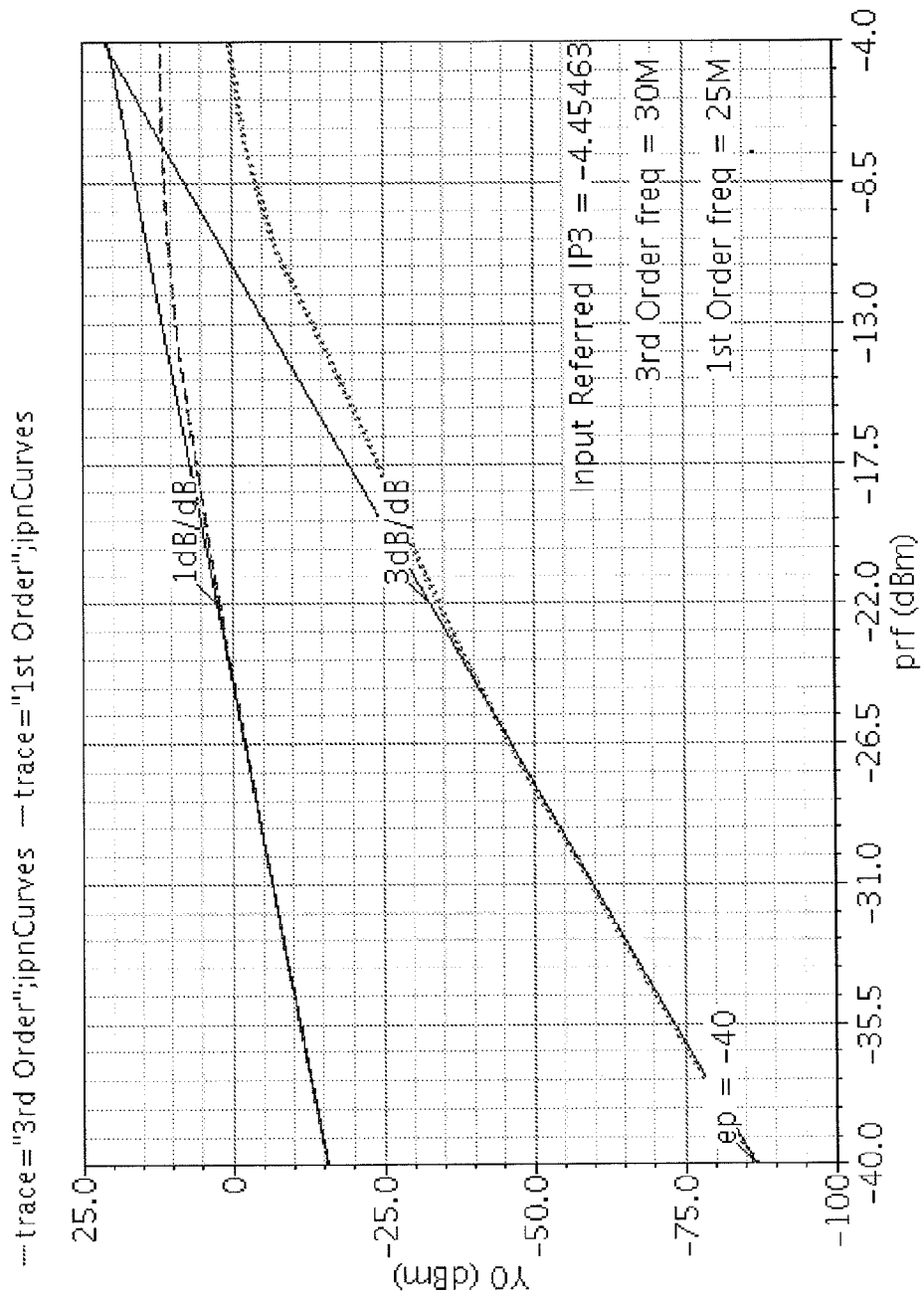

To validate the result, IP3 analysis was also performed using the traditional oscillator macromodeling technique. First, the local oscillator and the divider were simulated without the mixer circuit, and the result indicated that the divider output had a frequency of 2.5 GHz and an amplitude of 1.67V, as shown in FIG. 17. A macromodel having a sinusoid voltage source with the same frequency and amplitude was used to replace the oscillator and the divider in the receiver circuit. As shown in FIG. 18, the IP3 of the receiver from this simulation is −4.45 dB, which is more than 2 dB higher than the result of full circuit simulation depicted in FIG. 16.

Figure 19:
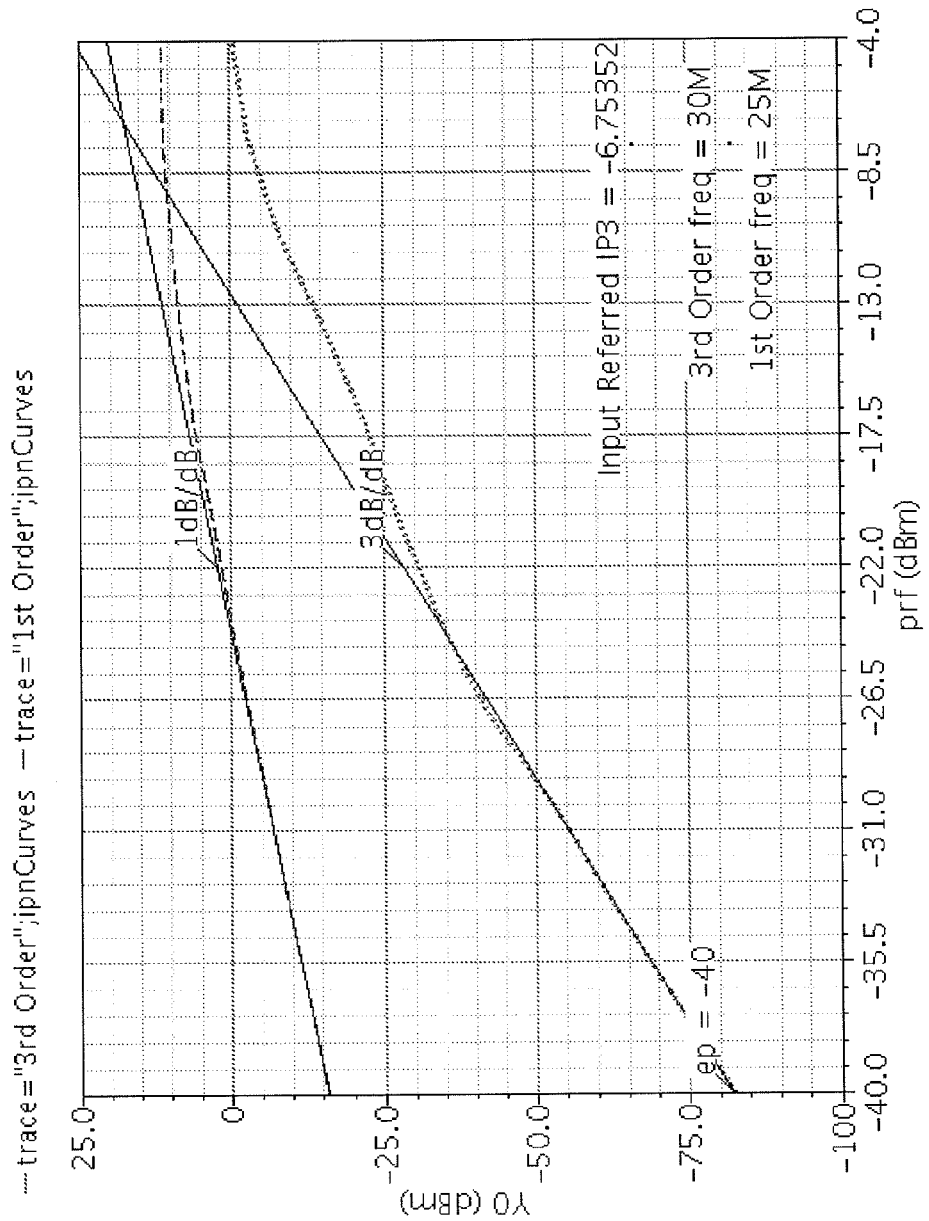

The discrepancy of 2 dB may be attributed to the inaccurate oscillator/divider macromodel. As shown in FIG. 17, the oscillator/divider output is not strictly sinusoidal, with many high order harmonics. A piecewise linear (PWL) macromodel having a waveform mimicking the waveform of FIG. 17 was used in the IP3 simulation again. The result is shown in FIG. 19, which indicates that the IP3 from the PWL macromodel is 6.75 dB, very close to the result from the multi-tone autonomous simulation.

Thus, the multi-tone autonomous simulation method provided by embodiments of the invention has better accuracy than the traditional macromodel-based method (especially so if the sinusoidal model is used). At the same time, direct simulation of the oscillator circuit is convenient and eliminates the need to break the circuit and build the PWL macromodels for local oscillators.

As noted above, the multi-tone harmonic balance method may have convergence problems when the frequency modulation is strong. In our experiments, the convergence of the method under different conditions was also evaluated. It has been found that the method has very good convergence for transceiver circuits, in part because the driven tone is well isolated by the mixer. For unlocked driven oscillator simulation, when the perturbation frequency is high, the convergence is relatively fast. According to an embodiment of the invention, increasing the harmonic number of the perturbation tone can improve the convergence when the perturbation frequency is low and the perturbation magnitude is large.

The examples described above demonstrate many benefits of the methods provided by embodiments of the present invention, including methods for multi-tone harmonic balance simulation for driven oscillators and methods for MPNV extraction for the small signal analysis of driven oscillator. The techniques have been shown to be accurate in real circuit simulations, as they can capture the expected effects. The techniques provided by embodiments of the invention greatly simplify the simulation process and improve the simulation accuracy, when designers need to evaluate the performance of large oscillator-involved systems.

In further embodiments, the methods described above are used in designing various circuits in semiconductor chips. In some embodiments, the method described herein are incorporated in circuit simulation tools that are used to design circuits for semiconductor chips. A semiconductor chip having a circuit designed using the methods provided by embodiments of the invention has many advantages over a chip designed with conventional methods. The advantages include more accurate and predictable performance, fewer design and debugging iterations, shorter design and manufacturing turn-around times, and reduced over-all cost, etc.

While certain embodiments of the invention have been illustrated and described, those skilled in the art with access to the present teachings will recognize that the invention is not limited to these embodiments only. Accordingly, it is to be understood that the invention is intended to cover numerous modifications, changes, variations, substitutions, and equivalents that will be apparent to those skilled in the art.

What is claimed is:

1. In a circuit simulation tool implemented in a computer system having one or more computer processors and a non-transitory computer-readable storage medium, a method for characterizing a driven oscillator circuit having an oscillator coupled to a time-varying input signal, the method comprising:
    retrieving from the non-transitory computer-readable storage medium information provided in a circuit description of the driven oscillator circuit;
    forming with one or more of the computer processors a frequency-domain harmonic balance equation for the driven oscillator circuit using the retrieved information provided in the circuit description of the driven oscillator circuit, the harmonic balance equation including a first differential operator in a frequency domain of the input signal and a product of a differential operator in a second frequency domain of the oscillator and a frequency variable of the oscillator, wherein the frequency variable is independent of the frequency domain of the input signal;
    forming a Jacobian matrix for the driven oscillator circuit;
    forming a non-singular multitone phase noise vector (MPNV) for characterizing a phase noise in the driven oscillator circuit, wherein the multitone phase noise vector is based upon, at least in part, the Jacobian matrix and wherein the Jacobian matrix is an augmented Jacobian matrix including a static part and a dynamic part expressed in the frequency domain; and
    solving with one or more of the computer processors the harmonic balance equation to obtain a waveform description of the driven oscillator circuit.

2. The method of claim 1, wherein:
    the driven oscillator circuit further comprises a second time-varying input signal;
    the harmonic balance equation further includes a third differential operator in a frequency domain of the second time-varying input signal; and
    the frequency variable of the oscillator is independent of the frequency domain of the second time-varying input signal.

3. The method of claim 1, wherein the harmonic balance equation in the frequency domain is described by:

$$H(X)=(\Omega_1+\omega_2\Omega_2)Q+F=B,$$

where
    X is a waveform of the oscillator,
    Q is a dynamic part of the driven oscillator circuit,
    F is a static part of the driven oscillator circuit,
    B is the injection signal in the frequency domain,
    $\Omega_1$ and $\Omega_2$ are frequency domain differential operators for $t_1$ and $t_2$, respectively, and
    $\omega_2$ is the frequency variable.

4. The method of claim 3, wherein solving the harmonic balance equation comprises solving the harmonic balance equation using the Newton-Raphson method.

5. The method of claim 3, wherein solving the harmonic balance equation comprises forming an augmented Jacobian matrix as described by:

$$J_{aug} = \begin{pmatrix} J & \Omega_2 Q \\ p & 0 \end{pmatrix},$$

where
    $J=(\Omega_1+\omega_2\Omega_2)C+G$ is a two-tone Jacobian matrix of the driven oscillator circuit,
    C is $$\frac{dq}{dx}$$

in the frequency domain,
    G is $$\frac{df}{dx}$$

in the frequency domain,
    q describes the dynamic part of the driven oscillator circuit,
    f describes the static part of the driven oscillator circuit,
    $\Omega_2 Q$ is $$\frac{dq}{dt_2}$$

in the frequency domain, and
    p is a phase equation.

6. The method of claim 5, further comprising wherein the MPNV being described by $V_1$ in the following equation:

$$\begin{pmatrix} J & \Omega_2 Q \\ p & 0 \end{pmatrix}^H \begin{pmatrix} V_1 \\ r \end{pmatrix} = \begin{pmatrix} 0 \\ 1 \end{pmatrix},$$

where
    H denotes a transpose conjugate,
    r is a variable,
    $J=(\Omega_1+\omega_2\Omega_2)C+G$ is the two-tone Jacobian matrix of the driven oscillator circuit, $\Omega_2 Q$ is $$\frac{dq}{dt_2}$$

in the frequency domain, and
p is the phase equation.

7. The method of claim 6, further comprising calculating a phase noise power spectrum density of the driven oscillator circuit using the following equations:

$$S(f) = \sum_{i=-N}^{N} X_i X_i^* S_i(f + if_0),$$

where $$S_i(f) = \frac{f_0^2 i^2 \sum_{k=1}^{n} |V_{0_k}|^2 S_{N_k}(f)}{\pi^2 f_0^4 i^4 \left(\sum_{k=1}^{n} |V_{0_k}|^2 S_{N_k}(f)\right)^2 + f^2},$$

$X_i$ is the Fourier coefficient of the oscillator output at harmonic index i,
N and n are integers,
f is a frequency variable,
$f_0$ is a frequency constant,
$V_{0k}$ is the DC Fourier coefficient of the MPNV of the node k, and
$S_{Nk}$ is the power spectrum density (PSD) of all colored noise sources applied to the node k.

8. The method of claim 1, wherein the circuit description comprises a netlist of the driven oscillator circuit.

9. The method of claim 1, wherein the circuit description comprises a schematic diagram of the driven oscillator circuit.

10. A method for characterizing a driven oscillator circuit, comprising:
providing, using one or more computer processors, a circuit description of the driven oscillator circuit, the driven oscillator circuit including an oscillator and a time-varying input signal coupled to the oscillator;
forming a system of differential equations, using the one or more computer processors, for the driven oscillator circuit using information provided in the circuit description, the system of differential equations including a first differential operator in a time domain of the input signal and a product of a second differential operator in the time domain of the oscillator and a frequency variable that represents a frequency of the oscillator, wherein the frequency variable is independent of the time domain of the input signal;
forming a Jacobian matrix for the driven oscillator circuit;
forming a non-singular multitone phase noise vector (MPNV) for characterizing a phase noise in the driven oscillator circuit, wherein the multitone phase noise vector is based upon, at least in part, the Jacobian matrix and wherein the Jacobian matrix is an augmented Jacobian matrix including a static part and a dynamic part expressed in the frequency domain; and
solving the system of differential equations, using the one or more computer processors, to obtain a waveform for characterizing the driven oscillator circuit.

11. The method of claim 10, wherein:
the driven oscillator circuit further comprises a second time-varying input signal;
the system of differential equations further includes a third differential operator in a time domain of the second time-varying input signal; and
the frequency variable of the oscillator is independent of the time domain of the second time-varying input signal.

12. The method of claim 10, wherein the circuit description comprises a netlist of the driven oscillator circuit.

13. The method of claim 10, wherein the circuit description comprises a schematic diagram of the driven oscillator circuit.

14. The method of claim 10, wherein the system of differential equations comprises a harmonic balance equation.

15. The method of claim 10, wherein forming the system of differential equations comprises forming a multi-tone partial differential equation (MPDE) using information provided in the circuit description, the MPDE being described by $$\left[\frac{\partial}{\partial t_1} + \omega_2 \frac{\partial}{\partial t_2}\right] q(x(t_1, t_2)) + f(x(t_1, t_2)) = b(t_1),$$

where
$x(t_1, t_2)$ describes a signal of the oscillator,
$q(\ldots)$ is the dynamic part of the multi-tone partial differential equation,
$f(\ldots)$ is the static part of the multi-tone partial differential equation,
$t_1$ is a time coordinate for the input signal,
$t_2$ is a time coordinate for the oscillator signal, $q(t_1, t_2)$,
$\omega_2$ is the frequency variable of the oscillator and is independent of the input signal time coordinate $t_1$.

16. The method of claim 10, wherein solving the system of differential equations comprises solving the equations in the time domain.

17. The method of claim 10, wherein forming a system of differential equations comprises forming a harmonic balance equation in the frequency domain for the driven oscillator circuit using information provided in the circuit description.

18. The method of claim 17, wherein forming a harmonic balance equation in the frequency domain comprises performing a Fourier transform operation to the system of differential equations.

19. The method of claim 17, wherein the harmonic balance equation in the frequency domain is described by:

$$H(X) = (\Omega_1 + \omega_2 \Omega_2) Q + F = B$$

where
X is a waveform of the oscillator,
Q is a dynamic part of the driven oscillator circuit,
F is a static part of the driven oscillator circuit,
B is the injection signal in the frequency domain,
$\Omega_1$ and $\Omega_2$ are frequency domain differential operators for $t_1$ and $t_2$, respectively, and
$\omega_2$ is the frequency variable.

20. The method of claim 19, wherein solving the harmonic balance equation comprises solving the harmonic balance equation using the Newton-Raphson method.

21. The method of claim 19, wherein solving the harmonic balance equation comprises forming an augmented Jacobian matrix as described by:

$$J_{aug} = \begin{pmatrix} J & \Omega_2 Q \\ p & 0 \end{pmatrix},$$

where
  $J=(\Omega_1+\omega_2\Omega_2)C+G$ is a two-tone Jacobian matrix of the driven oscillator circuit,
  C is $$\frac{dq}{dx}$$

in the frequency domain,
  G is $$\frac{df}{dx}$$

in the frequency domain,
  q is the dynamic part of the driven oscillator circuit,
  f is the static part of the driven oscillator circuit,
  $\Omega_2 Q$ is $$\frac{dq}{dt_2}$$

in the frequency domain, and
  p is a phase equation.

22. The method of claim 21, wherein the MPNV being described by $V_1$ in the following equation:

$$\begin{pmatrix} J & \Omega_2 Q \\ p & 0 \end{pmatrix}^H \begin{pmatrix} V_1 \\ r \end{pmatrix} = \begin{pmatrix} 0 \\ 1 \end{pmatrix},$$

where
  H denotes a transpose conjugate,
  r is a variable,
  $J=(\Omega_1+\omega_2\Omega_2)C+G$ is the two-tone Jacobian matrix of the driven oscillator circuit
  $\Omega_2 Q$ is $$\frac{dq}{dt_2}$$

in the frequency domain, and
  p is the phase equation.

23. The method of claim 22, further comprising calculating a phase noise power spectrum density of the driven oscillator circuit using the following equations:

$$S(f) = \sum_{i=-N}^{N} X_i X_i^* S_i(f+if_0),$$

where $$S_i(f) = \frac{f_0^2 i^2 \sum_{k=1}^{n} |V_{0_k}|^2 S_{N_k}(f)}{\pi^2 f_0^4 i^4 \left(\sum_{k=1}^{n} |V_{0_k}|^2 S_{N_k}(f)\right)^2 + f^2}.$$

$X_i$ is the Fourier coefficient of the oscillator output at harmonic index i,
  N and n are integers,
  f is a frequency variable,
  $f_0$ is a frequency constant,
  $V_{0_k}$ is the DC Fourier coefficient of the MPNV of the node k, and
  $S_{Nk}$ is the power spectrum density (PSD) of all colored noise sources applied to the node k.

24. A computer system for performing circuit simulation, the system comprising:
  a non-transitory computer-readable storage medium;
  one or more processors coupled to said non-transitory computer-readable storage medium; and
  computer code stored in said non-transitory computer-readable storage medium wherein said computer code, when retrieved from said non-transitory computer-readable storage medium and executed by said one or more processors, results in:
    retrieving from the non-transitory computer-readable storage medium information provided in a circuit description of a driven oscillator circuit having an oscillator coupled to a time-varying input signal;
    forming a Jacobian matrix for the driven oscillator circuit;
    forming a non-singular multitone phase noise vector (MPNV) for characterizing a phase noise in the driven oscillator circuit, wherein the multitone phase noise vector is based upon, at least in part, the Jacobian matrix and wherein the Jacobian matrix is an augmented Jacobian matrix including a static part and a dynamic part expressed in the frequency domain;
    forming with the one or more processors a frequency-domain harmonic balance equation for the driven oscillator circuit using the retrieved information provided in the circuit description of the driven oscillator circuit, the harmonic balance equation including a first differential operator in a frequency domain of the input signal and a product of a differential operator in a second frequency domain of the oscillator and a frequency variable of the oscillator, wherein the frequency variable is independent of the frequency domain of the input signal, wherein the harmonic balance equation in the frequency domain is described by:
    $H(X)=(\Omega_1+\omega_2\Omega_2)Q+F=B,$
  where
    X is a waveform of the oscillator,
    Q is a dynamic part of the driven oscillator circuit,
    F is a static part of the driven oscillator circuit,
    B is the injection signal in the frequency domain,
    $\Omega_1$ and $\Omega_2$ are frequency domain differential operators for $t_1$ and $t_2$, respectively, and
    $\omega_2$ is the frequency variable; and
    solving with the one or more processors the harmonic balance equation to obtain a waveform description of the driven oscillator circuit.

25. The computer system of claim 24, wherein:
the driven oscillator circuit further comprises a second time-varying input signal;
the harmonic balance equation further includes a third differential operator in a frequency domain of the second time-varying input signal; and
the frequency variable of the oscillator is independent of the frequency domain of the second time-varying input signal.

26. The computer system of claim 24, wherein solving the harmonic balance equation comprises forming an augmented Jacobian matrix as described by:

$$J_{aug} = \begin{pmatrix} J & \Omega_2 Q \\ p & 0 \end{pmatrix},$$

where
$J=(\Omega_1+\omega_2\Omega_2)C+G$ is a two-tone Jacobian matrix of the driven oscillator circuit,
$\Omega_2 Q$ is $$\frac{dq}{dt_2}$$

in the frequency domain, and
p is a phase equation.

27. The computer system of claim 26, further comprising forming a multitone phase noise vector (MPNV) for characterizing a phase noise in the driven oscillator circuit, the MPNV being described by $V_1$ in the following equation:

$$\begin{pmatrix} J & \Omega_2 Q \\ p & 0 \end{pmatrix}^H \begin{pmatrix} V_1 \\ r \end{pmatrix} = \begin{pmatrix} 0 \\ 1 \end{pmatrix},$$

where
H denotes a transpose conjugate,
r is a variable,
$J=(\Omega_1+\omega_2\Omega_2)C+G$ is the two-tone Jacobian matrix of the driven oscillator circuit,
C is $$\frac{dq}{dx}$$

in the frequency domain,
G is $$\frac{df}{dx}$$

in the frequency domain,
q is the dynamic part of the driven oscillator circuit,
f is the static part of the driven oscillator circuit,
$\Omega_2 Q$ is $$\frac{dq}{dt_2}$$

in the frequency domain, and
p is the phase equation.

28. A non-transitory computer readable storage medium comprising computer code stored in said non-transitory computer-readable storage medium, wherein said computer code, when retrieved from said non-transitory computer-readable storage medium and executed by one or more computer processors, results in:
retrieving from the non-transitory computer-readable storage medium information provided in a circuit description of a driven oscillator circuit having an oscillator coupled to a time-varying input signal;
forming with the one or more computer processors a frequency-domain harmonic balance equation for the driven oscillator circuit using the retrieved information provided in the circuit description of the driven oscillator circuit, the harmonic balance equation including a first differential operator in a frequency domain of the input signal and a product of a differential operator in a second frequency domain of the oscillator and a frequency variable of the oscillator, wherein the frequency variable is independent of the frequency domain of the input signal;
forming a Jacobian matrix for the driven oscillator circuit;
forming a non-singular multitone phase noise vector (MPNV) for characterizing a phase noise in the driven oscillator circuit, wherein the multitone phase noise vector is based upon, at least in part, the Jacobian matrix and wherein the Jacobian matrix is an augmented Jacobian matrix including a static part and a dynamic part expressed in the frequency domain; and
solving with the one or more computer processors the harmonic balance equation to obtain a waveform description of the driven oscillator circuit.

29. The non-transitory computer readable storage medium of claim 28, wherein:
the driven oscillator circuit further comprises a second time-varying input signal;
the harmonic balance equation further includes a third differential operator in a frequency domain of the second time-varying input signal; and
the frequency variable of the oscillator is independent of the frequency domain of the second time-varying input signal.

30. The non-transitory computer readable storage medium of claim 28, wherein the harmonic balance equation in the frequency domain is described by:

$$H(X)=(\Omega_1+\omega_2\Omega_2)Q+F=B$$

where
X is a waveform of the oscillator,
Q is a dynamic part of the driven oscillator circuit,
F is a static part of the driven oscillator circuit,
B is the injection signal in the frequency domain,
$\Omega_1$ and $\Omega_2$ are frequency domain differential operators for $t_1$ and $t_2$, respectively, and
$\omega_2$ is the frequency variable.

31. The non-transitory computer readable storage medium of claim 30, wherein solving the harmonic balance equation comprises forming an augmented Jacobian matrix as described by:

$$J_{aug} = \begin{pmatrix} J & \Omega_2 Q \\ p & 0 \end{pmatrix},$$

where
  $J=(\Omega_1+\omega_2\Omega_2)C+G$ is a two-tone Jacobian matrix of the driven oscillator circuit,
  C is $$\frac{dq}{dx}$$

in the frequency domain,
  G is $$\frac{df}{dx}$$

in the frequency domain,
  q is the dynamic part of the driven oscillator circuit,
  f is the static part of the driven oscillator circuit,
  $\Omega_2 Q$ is $$\frac{dq}{dt_2}$$

in the frequency domain, and
  p is a phase equation.

32. The non-transitory computer readable storage medium of claim 31, wherein the MPNV being described by $V_1$ in the following equation:

$$\begin{pmatrix} J & \Omega_2 Q \\ p & 0 \end{pmatrix}^H \begin{pmatrix} V_1 \\ r \end{pmatrix} = \begin{pmatrix} 0 \\ 1 \end{pmatrix},$$

where
  H denotes a transpose conjugate,
  r is a variable,
  $J=(\Omega_1+\omega_2\Omega_2)C+G$ is the two-tone Jacobian matrix of the driven oscillator circuit,
  $\Omega_2 Q$ $$\frac{dq}{dt_2}$$

in the frequency domain, and
  p is the phase equation.

33. In a circuit simulation tool implemented in a computer system having one or more computer processors and a non-transitory computer-readable storage medium, a system for characterizing a driven oscillator circuit having an oscillator coupled to a time-varying input signal, the system comprising:
  means for retrieving from the non-transitory computer-readable storage medium information provided in a circuit description of the driven oscillator circuit;
  means for forming with one or more of the computer processors a frequency-domain harmonic balance equation for the driven oscillator circuit using the retrieved information provided in the circuit description of the driven oscillator circuit, the harmonic balance equation including a first differential operator in a frequency domain of the input signal and a product of a differential operator in a second frequency domain of the oscillator and a frequency variable of the oscillator, wherein the frequency variable is independent of the frequency domain of the input signal;
  means for forming a Jacobian matrix for the driven oscillator circuit;
  means for forming a non-singular multitone phase noise vector (MPNV) for characterizing a phase noise in the driven oscillator circuit, wherein the multitone phase noise vector is based upon, at least in part, the Jacobian matrix and wherein the Jacobian matrix is an augmented Jacobian matrix including a static part and a dynamic part expressed in the frequency domain; and
  means for solving with one or more of the computer processors the harmonic balance equation to obtain a waveform description of the driven oscillator circuit.

34. The system of claim 33, wherein:
  the driven oscillator circuit further comprises a second time-varying input signal;
  the harmonic balance equation further includes a third differential operator in a frequency domain of the second time-varying input signal; and
  the frequency variable of the oscillator is independent of the frequency domain of the second time-varying input signal.

35. The system of claim 33, wherein the harmonic balance equation in the frequency domain is described by:

$$H(X)=(\Omega_1+\omega_2\Omega_2)Q+F=B$$

where
  X is a waveform of the oscillator,
  Q is a dynamic part of the driven oscillator circuit,
  F is a static part of the driven oscillator circuit,
  B is the injection signal in the frequency domain,
  $\Omega_1$ and $\Omega_2$ are frequency domain differential operators for $t_1$ and $t_2$, respectively, and
  $\omega_2$ is the frequency variable.

36. The system of claim 33, wherein the means for solving the harmonic balance equation comprises means for forming an augmented Jacobian matrix as described by:

$$J_{aug} = \begin{pmatrix} J & \Omega_2 Q \\ p & 0 \end{pmatrix},$$

where
  $J=(\Omega_1+\omega_2\Omega_2)C+G$ is a two-tone Jacobian matrix of the driven oscillator circuit,
  C is $$\frac{dq}{dx}$$

in the frequency domain,
  G is $$\frac{df}{dx}$$

in the frequency domain,
q is the dynamic part of the driven oscillator circuit,
f is the static part of the driven oscillator circuit,
$\Omega_2 Q$ is $$\frac{dq}{dt_2}$$

in the frequency domain, and
p is a phase equation.

37. The system of claim 36, wherein the MPNV being described by $V_1$ in the following equation:

$$\begin{pmatrix} J & \Omega_2 Q \\ p & 0 \end{pmatrix}^H \begin{pmatrix} V_1 \\ r \end{pmatrix} = \begin{pmatrix} 0 \\ 1 \end{pmatrix},$$

where
H denotes a transpose conjugate,
r is a variable,
$J = (\Omega_1 + \omega_2 \Omega_2)C + G$ is the two-tone Jacobian matrix of the driven oscillator circuit,
$\Omega_2 Q$ is $$\frac{dq}{dt_2}$$

in the frequency domain, and
p is the phase equation.

38. The system of claim 37, further comprising means for calculating a phase noise power spectrum density of the driven oscillator circuit using the following equations:

$$S(f) = \sum_{i=-N}^{N} X_i X_i^* S_i(f + if_0),$$

where $$S_i(f) = \frac{f_0^2 i^2 \sum_{k=1}^{n} |V_{0_k}|^2 S_{N_k}(f)}{\pi^2 f_0^4 i^4 \left( \sum_{k=1}^{n} |V_{0_k}|^2 S_{N_k}(f) \right)^2 + f^2}.$$

$X_i$ is the Fourier coefficient of the oscillator output at harmonic index i,
N and n are integers,
f is a frequency variable,
$f_0$ is a frequency constant,
$V_{0k}$ is the DC Fourier coefficient of the MPNV of the node k, and
$S_{Nk}$ is the power spectrum density (PSD) of all colored noise sources applied to the node k.

* * * * *